(12) United States Patent
Cho et al.

(10) Patent No.: US 11,974,440 B2
(45) Date of Patent: Apr. 30, 2024

(54) PAGE BUFFER CIRCUIT AND MEMORY DEVICE INCLUDING THE SAME

(71) Applicant: SAMSUNG ELECTRONICS CO., LTD., Suwon-si (KR)

(72) Inventors: Yongsung Cho, Hwaseong-si (KR); Inho Kang, Yongin-si (KR); Ansoo Park, Hwaseong-si (KR); Jeunghwan Park, Suwon-si (KR); Dongha Shin, Hwaseong-si (KR); Jeawon Jeong, Gwacheon-si (KR)

(73) Assignee: Samsung Electronics Co., Ltd. (KR)

( * ) Notice: Subject to any disclaimer, the term of this patent is extended or adjusted under 35 U.S.C. 154(b) by 348 days.

(21) Appl. No.: 17/219,299

(22) Filed: Mar. 31, 2021

(65) Prior Publication Data
US 2022/0045080 A1    Feb. 10, 2022

(30) Foreign Application Priority Data
Aug. 10, 2020    (KR) .......................... 10-2020-0100118

(51) Int. Cl.
| | |
|---|---|
| G11C 11/00 | (2006.01) |
| G06F 3/06 | (2006.01) |
| H10B 43/27 | (2023.01) |
| H10B 43/35 | (2023.01) |
| H10B 43/40 | (2023.01) |

(52) U.S. Cl.
CPC ........... *H10B 43/40* (2023.02); *G06F 3/0656* (2013.01); *H10B 43/27* (2023.02); *H10B 43/35* (2023.02)

(58) Field of Classification Search
CPC .................................................... G06F 3/0656
See application file for complete search history.

(56) References Cited

U.S. PATENT DOCUMENTS

| | | |
|---|---|---|
| 9,887,208 B2 | 2/2018 | Son et al. |
| 10,381,373 B2 | 8/2019 | Okizumi et al. |
| 10,510,738 B2 | 12/2019 | Kim et al. |

(Continued)

FOREIGN PATENT DOCUMENTS

KR    1020070084787 A    8/2007

OTHER PUBLICATIONS

Communication dated Nov. 5, 2021 issued by the European Intellectual Property Office in counterpart European Application No. 21173622.8.

(Continued)

*Primary Examiner* — Pho M Luu
(74) *Attorney, Agent, or Firm* — Fish & Richardson P.C.

(57) ABSTRACT

A memory device includes: a memory cell array including a plurality of memory cells; and a page buffer circuit provided in a page buffer region including a main region and a cache region provided in a first horizontal direction, and including a first page buffer unit and a second page buffer unit adjacent to each other in a second horizontal direction in the main region. A first sensing node of the first page buffer unit includes a first lower metal pattern, and a first upper metal pattern, and electrically connected to the first lower metal pattern. A second sensing node of the second page buffer unit includes a second lower metal pattern, and a second upper metal pattern, electrically connected to the second lower metal pattern, and not adjacent to the first upper metal pattern in the second horizontal direction.

18 Claims, 30 Drawing Sheets

(56) References Cited

U.S. PATENT DOCUMENTS

| | | |
|---|---|---|
| 10,515,897 B2 | 12/2019 | Nishikawa et al. |
| 11,158,381 B2 * | 10/2021 | Lee .................... G11C 16/3459 |
| 11,742,023 B2 * | 8/2023 | Jung ................. G11C 16/0483 |
| | | 365/185.12 |
| 2006/0013045 A1 * | 1/2006 | Lee ...................... G11C 7/1078 |
| | | 365/189.05 |
| 2007/0297233 A1 | 12/2007 | Maejima |
| 2008/0225591 A1 | 9/2008 | Hosono et al. |
| 2011/0228603 A1 | 9/2011 | Takashima |
| 2016/0343450 A1 | 11/2016 | Lee et al. |
| 2018/0277225 A1 | 9/2018 | Park |
| 2019/0043872 A1 | 2/2019 | Oh et al. |
| 2019/0385674 A1 | 12/2019 | Cho et al. |
| 2020/0027835 A1 | 1/2020 | Hsu et al. |
| 2020/0027893 A1 | 1/2020 | Yang et al. |
| 2021/0166747 A1 * | 6/2021 | Choi ........................ G11C 7/22 |

OTHER PUBLICATIONS

EETimes.com [online], "IC layout must avoid crosstalk problems," Jun. 5, 2002, retrieved on Apr. 11, 2023, retrieved from URL<https://www.eetimes.com/ic-layout-must-avoid-crosstalk-problems/>, 5 pages.
Office Action in German Appln. No. 102021106214.4, dated Apr. 25, 2023, 17 pages (with English translation).
Office Action in European Appln. No. 21173622.8, mailed on Mar. 11, 2024, 10 pages.

* cited by examiner

PAGE BUFFER CIRCUIT AND MEMORY DEVICE INCLUDING THE SAME

CROSS-REFERENCE TO RELATED APPLICATION

This application is based on and claims priority under 35 U.S.C. § 119 to Korean Patent Application No. 10-2020-0100118, filed on Aug. 10, 2020, in the Korean Intellectual Property Office, the disclosure of which is incorporated by reference herein in its entirety.

BACKGROUND

The inventive concept relates to a memory device, and more particularly, to a page buffer circuit and a memory device including the page buffer circuit.

Recently, communication devices that have multi-functionality and process large amount of information have been developed, and as such, memory devices have been demanded to have a large capacity and be highly integrated. A memory device may include a page buffer to store data in memory cells or output data from memory cells, and the page buffer may have semiconductor devices such as a transistor. The demand for a decrease in a page buffer size according to an increase in a degree of integration of a memory device and the development of a process technique may cause a decrease in a semiconductor device size, and accordingly, a layout of wirings connected to semiconductor devices may be complicated.

SUMMARY

According to an example embodiment, there is provided a memory device comprising: a memory cell array including a plurality of memory cells; and a page buffer circuit connected to the memory cell array, the page buffer circuit being provided in a page buffer region, the page buffer region including a main region and a cache region arranged in a first horizontal direction, and the page buffer circuit comprising a first page buffer unit and a second page buffer unit arranged in the main region in a second horizontal direction, wherein the first page buffer unit comprises a first sensing node and the second page buffer unit comprises a second sensing node, wherein the first sensing node comprises: a first lower metal pattern provided in a lower metal layer; and a first upper metal pattern provided in an upper metal layer provided above the lower metal layer in a vertical direction, and the first upper metal pattern electrically connected to the first lower metal pattern, and wherein the second sensing node comprises: a second lower metal pattern provided in the lower metal layer; and a second upper metal pattern provided in the upper metal layer, the second upper metal pattern electrically connected to the second lower metal pattern, and the second upper metal pattern not adjacent to the first upper metal pattern in the second horizontal direction.

According to another example embodiment, there is provided a memory device comprising: a first semiconductor layer including a plurality of memory cells respectively connected to a plurality of bit lines extending in a first horizontal direction; and a second semiconductor layer provided in a vertical direction that is perpendicular to the first semiconductor layer, the second semiconductor layer including a plurality of page buffers, wherein the plurality of page buffers comprises a first page buffer unit including a first sensing node and a second page buffer unit including a second sensing node, wherein the first sensing node comprises: a first lower metal pattern provided in a lower metal layer; and a first upper metal pattern provided in an upper metal layer provided above the lower metal layer in the vertical direction, and electrically connected to the lower metal pattern, wherein the second sensing node comprises: a second lower metal pattern provided in the lower metal layer; and a second upper metal pattern provided in the upper metal layer, wherein the second page buffer unit is provided adjacent to the first page buffer unit in a second horizontal direction, and wherein the first upper metal pattern is not adjacent to the second upper metal pattern in the second horizontal direction.

According to another example embodiment, there is provided a memory device comprising: a memory cell region including a plurality of memory cells and a first metal pad; and a peripheral circuit region including a second metal pad and connected to the memory cell region in a vertical direction through the first metal pad and the second metal pad, wherein the peripheral circuit region further includes a plurality of page buffers, wherein the plurality of page buffers comprises a first page buffer unit including a first sensing node and a second page buffer unit including a second sensing node, wherein the first sensing node comprises: a first lower metal pattern provided in a lower metal layer; and a first upper metal pattern provided in an upper metal layer provided above the lower metal layer in the vertical direction, and electrically connected to the lower metal pattern, wherein the second sensing node comprises: a second lower metal pattern provided in the lower metal layer; and a second upper metal pattern provided in the upper metal layer, wherein the second page buffer unit is provided adjacent to the first page buffer unit in a second horizontal direction, and wherein the first upper metal pattern is not adjacent to the second upper metal pattern in the second horizontal direction.

According to another example embodiment, there is provided a page buffer circuit provided in a page buffer region including a main region and a cache region provided adjacent to each other in a first horizontal direction, the page buffer circuit comprising: a first sensing latch and a second sensing latch provided in the main region, the first sensing latch and the second sensing latch being adjacent to each other in a second horizontal direction; a first cache latch and a second cache latch provided in the cache region, the first cache latch and the second cache latch being adjacent to each other in the second horizontal direction, and respectively connected to the first sensing latch and the second sensing latch; a lower metal layer including a first lower metal pattern provided above the first and second sensing latches in a vertical direction and corresponding to a first sensing node connected to the first sensing latch, and a second lower metal pattern provided above the first and second sensing latches in the vertical direction corresponding to a second sensing node connected to the second sensing latch; and an upper metal layer including a first upper metal pattern provided above the lower metal layer in the vertical direction and connected to the first lower metal pattern, and a second upper metal pattern provided above the lower metal layer in the vertical direction connected to the second lower metal pattern, wherein the first and second upper metal patterns are not adjacent to each other in the second horizontal direction.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described in detail with reference to the accompanying drawings.

Figure 1:
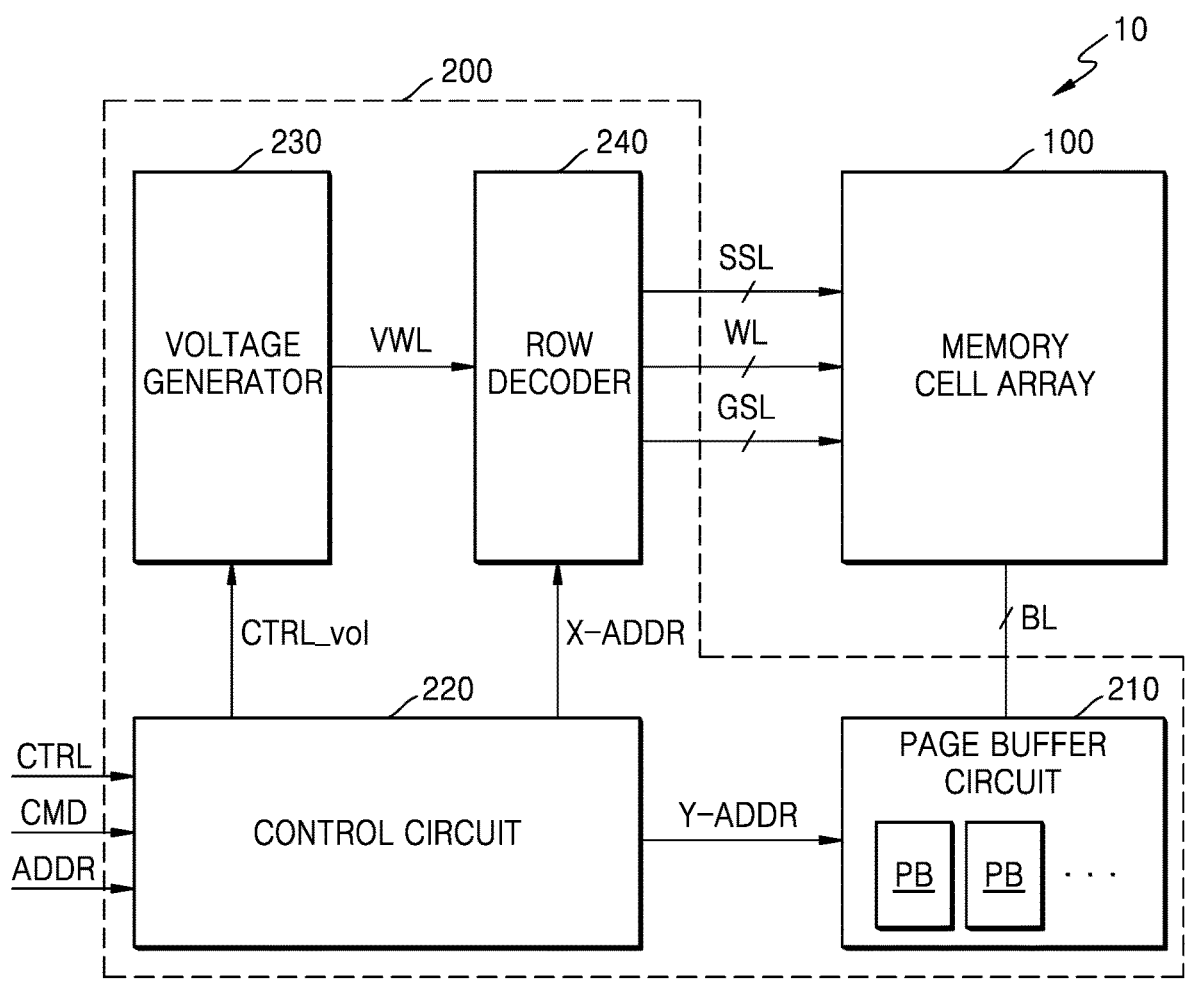
FIG. 1 is a block diagram of a memory device according to an example embodiment of the inventive concept.

FIG. 1 is a block diagram of a memory device 10 according to an example embodiment of the inventive concept.

Referring to FIG. 1, the memory device 10 may include a memory cell array 100 and a peripheral circuit 200. According to an example embodiment, the peripheral circuit 200 may include a page buffer circuit 210, a control circuit 220, a voltage generator 230, and a row decoder 240. According to an example embodiment, the peripheral circuit 200 may further include a data input-output circuit, an input-output interface, or the like.

The memory cell array 100 may be connected to the page buffer circuit 210 through bit lines BL, and may be connected to the row decoder 240 through word lines WL, string select lines SSL, and ground select lines GSL. The memory cell array 100 may include a plurality of memory cells, and the memory cells may be, for example, flash memory cells. Hereinafter, embodiments of the inventive concept will be described in detail for a case, as an example, where the plurality of memory cells are NAND flash memory cells. However, the inventive concept is not limited thereto, and in some example embodiments, the plurality of memory cells may be resistive memory cells such as resistive random access memory (ReRAM), phase change RAM (PRAM) or magnetic RAM (MRAM).

In an example embodiment, the memory cell array 100 may include a three-dimensional memory cell array, the three-dimensional memory cell array may include a plurality of NAND strings, each NAND string may include memory cells respectively connected to word lines vertically stacked on a substrate, and this will be described in detail with reference to FIGS. 3 and 4. U.S. Pat. Nos. 7,679,133, 8,553,466, 8,654,587, and 8,559,235 and US Patent Application Publication No. 2011/0233648 all of which are incorporated herein by reference describe, in detail, appropriate features of a three-dimensional memory cell array configured on a plurality of levels, wherein word lines and/or bit lines are shared among the levels. However, the inventive concept is not limited thereto, and in some example embodiments, the memory cell array 100 may include a two-dimensional memory cell array, and the two-dimensional memory cell array may include a plurality of NAND strings provided in row and column directions.

The control circuit 220 may output various kinds of control signals, e.g., a voltage control signal CTRL_vol, a row address X-ADDR, and a column address Y-ADDR, for programming data on the memory cell array 100, reading data from the memory cell array 100, or erasing data stored in the memory cell array 100, based on a command CMD, an address ADDR, and a control signal CTRL. By doing this, the control circuit 220 may generally control various kinds of operations in the memory device 10.

The voltage generator 230 may generate various types of voltages for performing program, read, and erase operations on the memory cell array 100, based on the voltage control signal CTRL_vol. Particularly, the voltage generator 230 may generate a word line voltage VWL, e.g., a program voltage, a read voltage, a pass voltage, an erase voltage, or a program verify voltage. In addition, the voltage generator 230 may further generate a string select line voltage and a ground select line voltage based on the voltage control signal CTRL_vol.

In response to the row address X-ADDR, the row decoder 240 may select one of a plurality of memory blocks, select one of word lines WL of the selected memory block, and select one of a plurality of string select lines SSL. The page buffer circuit 210 may select some of bit lines BL in response to the column address Y-ADDR. For example, the page buffer circuit 210 operates as a write driver or a sensing amplifier according to an operation mode.

The page buffer circuit 210 may include a plurality of page buffers PB respectively connected to a plurality of bit lines BL. In the example embodiment, page buffer units (e.g., PBU0 to PBU7 of FIG. 6) included in each of the plurality of page buffers PB and cache units (e.g., CU0 to CU7 of FIG. 6) included in each of the plurality of page buffers PB may be separated and isolated from each other. Accordingly, a degree of freedom of wirings on the page buffer units may be improved, and a complexity of a layout may decrease. In addition, the cache units may be provided to be adjacent to data input-output lines, so that a distance between the cache units and the data input-output lines decreases, thereby improving a data input-output rate.

In an example embodiment, a sensing node of each page buffer unit may be implemented using a plurality of metal layers provided in a vertical direction, and accordingly, a capacitance of the sensing node may increase. According to an example embodiment, a "metal layer" may indicate a "conductive layer" and may not be limited to a metal material. In addition, shielding metal patterns to which a power supply voltage or a ground voltage is applied may be provided at both sides of a metal pattern on which a sensing node is implemented, and accordingly, coupling by an adjacent sensing node may be prevented. Therefore, in a read operation on the memory device 10, a voltage variation of a sensing node may be reduced, and thus, the read reliability of the memory device 10 may be improved.

Figure 2:
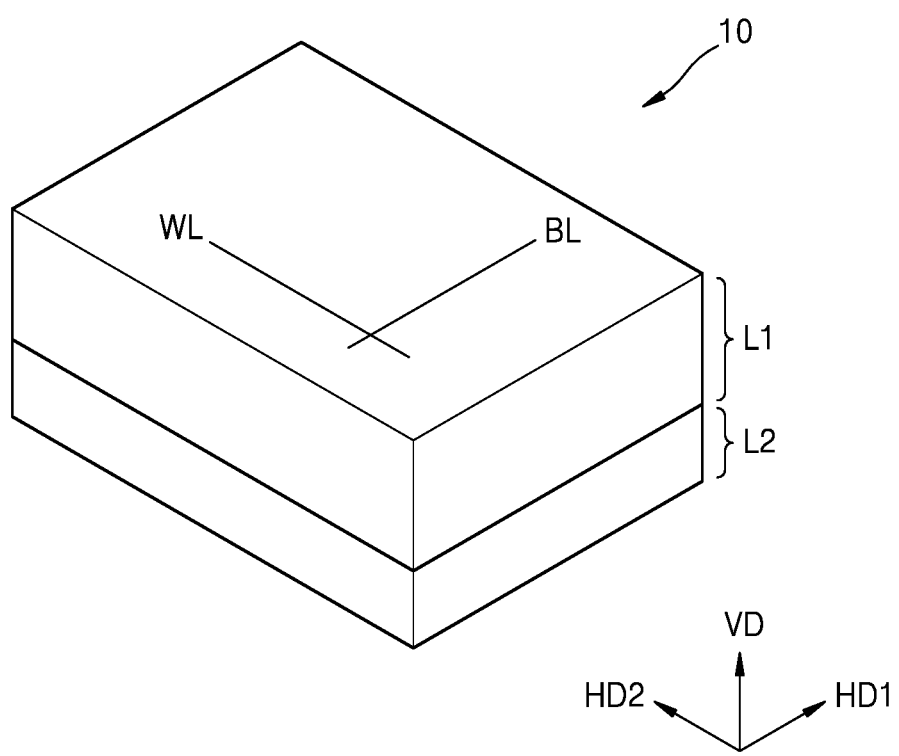
FIG. 2 is a perspective view of the memory device of FIG. 1, according to an example embodiment of the inventive concept.

FIG. 2 is a perspective view of the memory device 10 of FIG. 1, according to an example embodiment of the inventive concept.

Referring to FIG. 2, the memory device 10 may include a first semiconductor layer L1 and a second semiconductor layer L2, and the first semiconductor layer L1 may be stacked on the second semiconductor layer L2 in a vertical direction VD. Particularly, the second semiconductor layer L2 may be provided below the first semiconductor layer L1 in the vertical direction VD, and accordingly, the second semiconductor layer L2 may be closer to a substrate.

In an example embodiment, the memory cell array 100 of FIG. 1 may be formed in the first semiconductor layer L1, and the peripheral circuit 200 of FIG. 1 may be formed in the second semiconductor layer L2. Accordingly, the memory device 10 may have a structure in which the memory cell array 100 is on the peripheral circuit 200, i.e., a cell over periphery (COP) structure. The COP structure may effectively decrease an area in a horizontal direction and improve a degree of integration of the memory device 10.

In an example embodiment, the second semiconductor layer L2 may include a substrate, and the peripheral circuit 200 may be formed in the second semiconductor layer L2 by forming transistors and metal patterns (e.g., first to third metal layers LM0, LM2, and LM3 of FIG. 11) on the substrate, where the metal patterns interconnect the transistors on the substrate. After forming the peripheral circuit 200 in the second semiconductor layer L2, the first semiconductor layer L1 including the memory cell array 100 may be formed, and metal patterns for electrically connecting word lines WL and bit lines BL of the memory cell array 100 to the peripheral circuit 200 formed in the second semiconductor layer L2 may be formed. For example, the bit lines BL may extend in a first horizontal direction HD1, and the word lines WL may extend in a second horizontal direction HD2.

Along with the development of a semiconductor process, an increased number of tiers of memory cells may be provided in the memory cell array 100. In other words, the greater the number of stacks of word lines WL, the less an area of the memory cell array 100, and accordingly, the less an area of the peripheral circuit 200. According to the example embodiment, to decrease an area of a region occupied by the page buffer circuit 210, the page buffer circuit 210 may have a structure in which a page buffer unit is separated from a cache latch, and sensing nodes respectively included in page buffer units may be commonly connected to a combined sensing node. This will be described in detail with reference to FIG. 6.

Figure 3:
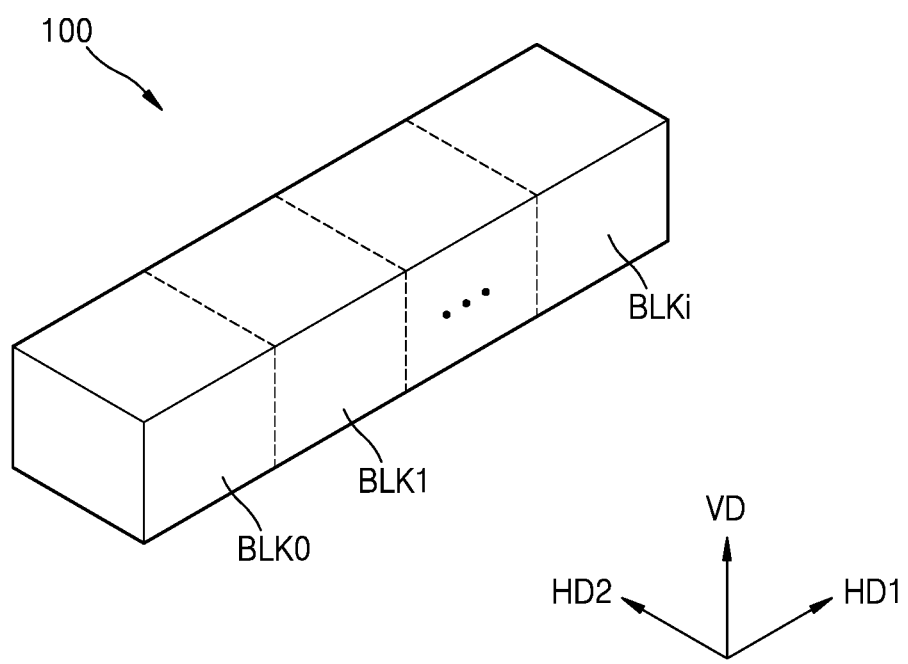
FIG. 3 is a perspective view of a memory cell array of FIG. 1, according to an example embodiment of the inventive concept.

FIG. 3 is a perspective view of the memory cell array 100 of FIG. 1, according to an example embodiment of the inventive concept.

Referring to FIG. 3, the memory cell array 100 may include a plurality of memory blocks BLK0, BLK1, . . . , BLKi, where i denotes a positive integer. Each of the plurality of memory blocks BLK0 to BLKi may have a three-dimensional structure. For example, each of the plurality of memory blocks BLK0 to BLKi may have a vertical structure. For example, each of the plurality of memory blocks BLK0 to BLKi may include a plurality of NAND strings extending in the vertical direction VD. In this case, the plurality of NAND strings may be separated by a particular distance in the first and second horizontal directions HD1 and HD2. The plurality of memory blocks BLK0 to BLKi may be selected by a row decoder (i.e., row decoder 240 of FIG. 1). For example, the row decoder 240 may select a memory block corresponding to a block address from among the plurality of memory blocks BLK0 to BLKi.

Figure 4:
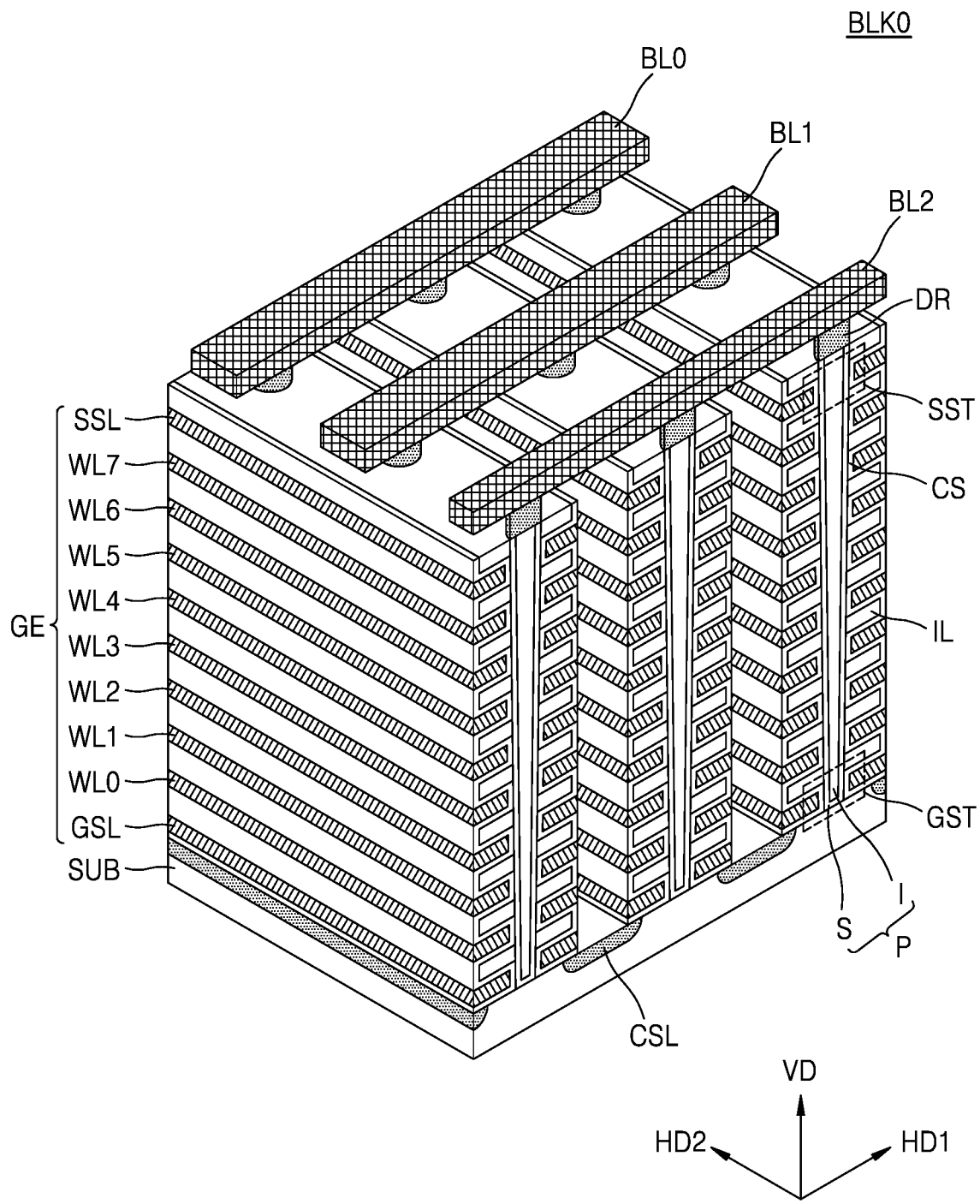
FIG. 4 is a perspective view of a memory block of FIG. 3, according to an example embodiment of the inventive concept.

FIG. 4 is a perspective view of a memory block BLK0 of FIG. 3, according to an example embodiment of the inventive concept.

Referring to FIG. 4, the memory block BLK0 is formed on a substrate SUB in the vertical direction VD. The substrate SUB has a first conductive type (e.g., a p-type) and includes common source lines CSL extending on the substrate SUB in the second horizontal direction HD2 and doped with second conductive-type (e.g., n-type) impurities. However, the disclosure is not limited to a substrate SUB that has a p-type conductive type, and as such, according to another example embodiment, the substrate SUB may a n-type conductivity and may include common source lines CSL extending on the substrate SUB in the second horizontal direction HD2 and doped with p-type conductivity impurities.

A plurality of insulating films IL extending in the second horizontal direction HD2 are sequentially provided on a region of the substrate SUB between two adjacent common source lines CSL in the vertical direction VD, and the plurality of insulating films IL are separated by a particular distance in the vertical direction VD. For example, the plurality of insulating films IL may include an insulating material such as silicon oxide.

On the region of the substrate SUB between the two adjacent common source lines CSL, a plurality of pillars P sequentially provided in the first horizontal direction HD1 and passing through the plurality of insulating films IL in the vertical direction VD are provided. For example, the plurality of pillars P may come in contact with the substrate SUB by passing through the plurality of insulating films IL. Particularly, a surface layer S of each pillar P may include a silicon material having a first type and function as a channel region. An inner layer I of each pillar P may include an insulating material, such as silicon oxide, or an air gap.

On the region between the two adjacent common source lines CSL, a charge storage layer CS is provided along exposed surfaces of the plurality of insulating films IL, the plurality of pillars P, and the substrate SUB The charge storage layer CS may include a gate insulating layer (or a tunneling insulating layer), a charge trap layer, and a blocking insulating layer. For example, the charge storage layer CS may have an oxide-nitride-oxide (ONO) structure. In addition, on the region between the two adjacent common source lines CSL, a gate electrode GE including select lines GSL and SSL and word lines WL0 to WL7 is provided on an exposed surface of the charge storage layer CS. According to an example embodiment, a string select transistor SST is provided corresponding the string select lines SSL, and a ground select transistor GST is provided corresponding the ground select lines GSL.

Each of drains or drain contacts DR is provided on the plurality of pillars P. For example, the drains or drain contacts DR may include a silicon material doped with impurities having a second conductive type. Bit lines BL0 to BL2 extending in the first horizontal direction HD1 and separated by a particular distance in the second horizontal direction HD2 are provided on the drains DR.

Figure 5:
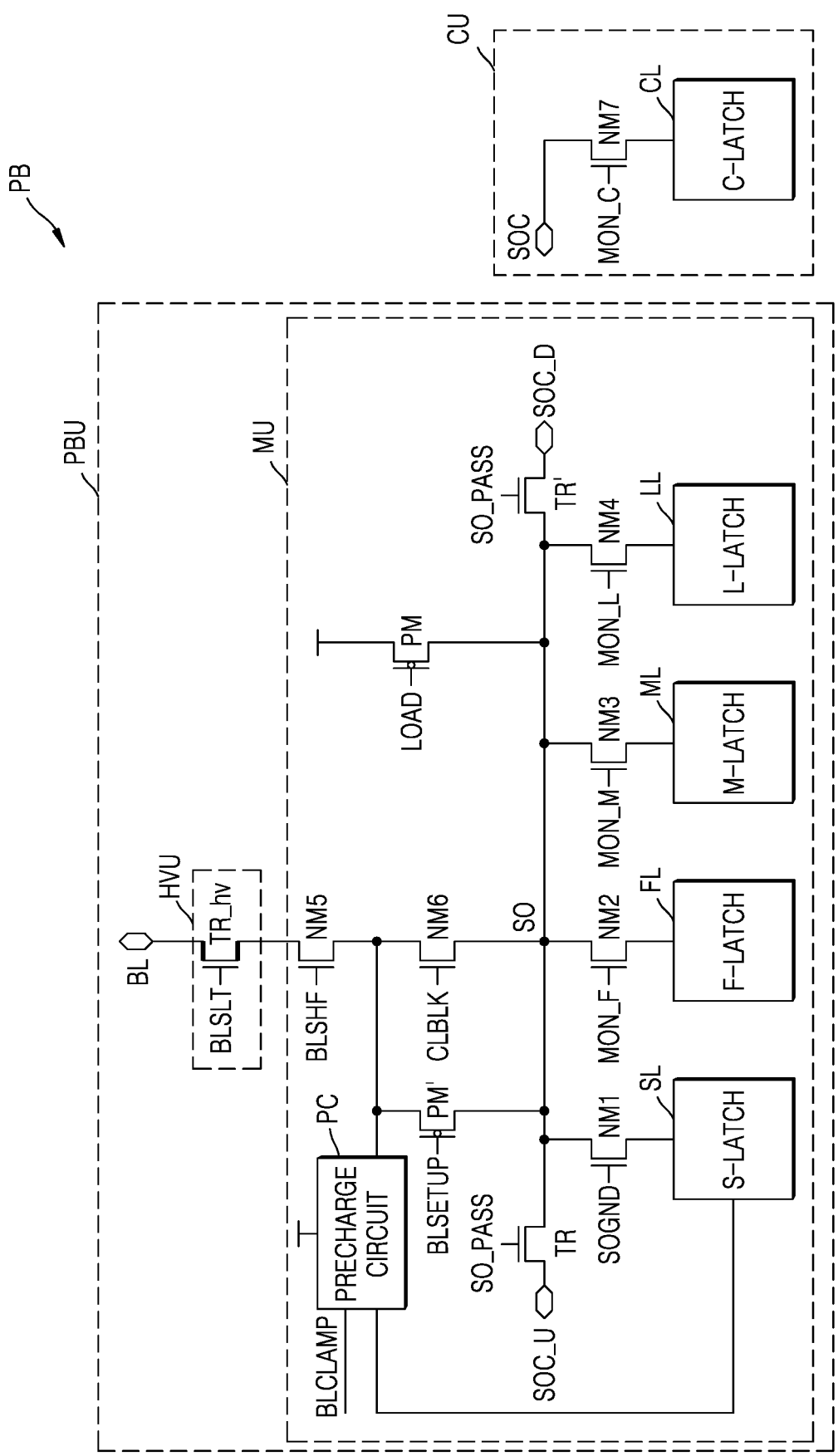
FIG. 5 is a circuit diagram of a page buffer according to an example embodiment of the inventive concept.

FIG. 5 is a circuit diagram of a page buffer PB according to an example embodiment of the inventive concept.

Referring to FIG. 5, the page buffer PB may correspond to an example of the page buffer PB of FIG. 1. The page buffer PB may include a page buffer unit PBU and a cache unit CU. The cache unit CU may include a cache latch (C-LATCH) CL. According to an example embodiment, the C-LATCH CL is connected to a data input-output line, and as such, the cache unit CU may be adjacent to the data input-output line. Accordingly, the page buffer unit PBU may be separated from the cache unit CU, and the page buffer PB may have a separated structure corresponding to the page buffer unit PBU and the cache unit CU.

The page buffer unit PBU may include a main unit MU. The main unit MU may include major transistors in the page buffer PB. The page buffer unit PBU may further include a bit line select transistor TR_hv connected to a bit line BL and driven by a bit line select signal BLSLT. The bit line select transistor TR_hv may be implemented by a high voltage transistor, and accordingly, the bit line select transistor TR_hv may be provided in a well region, i.e., a high voltage unit HVU, different from the main unit MU.

The main unit MU may include a sensing latch (S-LATCH) SL, a force latch (F-LATCH) FL, an upper bit latch or a most significant bit latch (M-LATCH) ML, and a lower bit latch or a least significant bit latch (L-LATCH) LL. According to an example embodiment, the S-LATCH SL, the F-LATCH FL, the M-LATCH ML, or the L-LATCH LL may be referred to as a "main latch". The main unit MU may further include a precharge circuit PC capable of controlling a precharge operation of the bit line BL or a sensing node SO based on a bit line clamping control signal BLCLAMP, and a transistor PM' driven by a bit line setup signal BLSETUP.

The S-LATCH SL may store data stored in a memory cell or a sensing result of a threshold voltage of the memory cell in a read or program verify operation. In addition, the S-LATCH SL may be used to apply a program bit line voltage or a program inhibit voltage to the bit line BL in a program operation. The F-LATCH FL may be used to improve a threshold voltage distribution in a program operation. The M-LATCH ML and the L-LATCH LL of the page buffer unit PBU, and the C-LATCH CL of the cache unit CU may be used to store data input from the outside in a program operation and may be referred to as a "data latch". When 3-bit data is programmed on one memory cell, the 3-bit data may be stored in the M-LATCH ML, the L-LATCH LL, and the C-LATCH CL, respectively. For example, 1-bit from the 3-bit data may be stored in each of the M-LATCH ML, the L-LATCH LL, and the C-LATCH CL, respectively. In addition, in a read operation, the C-LATCH CL may receive, from the S-LATCH SL, data read from a memory cell and output the data to the outside through a data input-output line.

In addition, the main unit MU may further include first to fourth transistors NM1 to NM4. The first transistor NM1 may be connected between the sensing node SO and the S-LATCH SL and may be driven by a ground control signal SOGND. The second transistor NM2 may be connected between the sensing node SO and the F-LATCH FL and may be driven by a forcing monitoring signal MON_F. The third transistor NM3 may be connected between the sensing node SO and the M-LATCH ML and may be driven by a most significant bit monitoring signal MON_M. The fourth transistor NM4 may be connected between the sensing node SO and the L-LATCH LL and may be driven by a least significant bit monitoring signal MON_L.

In addition, the main unit MU may further include fifth and sixth transistors NM5 and NM6 connected in series between the bit line select transistor TR_hv and the sensing node SO. The fifth transistor NM5 may be driven by a bit line shut-off signal BLSHF, and the sixth transistor NM6 may be driven by a bit line connection control signal CLBLK. In addition, the main unit MU may further include a precharge transistor PM. The precharge transistor PM may be connected to the sensing node SO, may be driven by a load signal LOAD, and may precharge the sensing node SO to a precharge level in a precharge duration.

In the example embodiment, the main unit MU may further include a pair of pass transistors, i.e., first and second pass transistors TR and TR', connected to the sensing node SO. According to an example embodiment, the first and second pass transistors TR and TR' may be referred to as "first and second sensing node connection transistors". The first and second pass transistors TR and TR' may be driven by a pass control signal SO_PASS. According to an example embodiment, the pass control signal SO_PASS may be referred to as a "sensing node connection control signal". The first pass transistor TR may be connected between a first terminal SOC_U and the sensing node SO, and the second pass transistor TR' may be connected between the sensing node SO and a second terminal SOC_D.

The page buffer PB may verify whether a memory cell selected from among memory cells included in a NAND string connected to the bit line BL is completely programmed in a program operation. Particularly, in a program verify operation, the page buffer PB may store, in the S-LATCH SL, data sensed through the bit line BL. According to the sensed data stored in the S-LATCH SL, the M-LATCH ML and the L-LATCH LL in which target data is stored are set. For example, when the sensed data indicates program completion, the M-LATCH ML and the L-LATCH LL switch to a program inhibit setting for the selected memory cell in a subsequent program loop. The C-LATCH CL may temporarily store input data provided from the outside. In a program operation, target data stored in the C-LATCH CL may be stored in the M-LATCH ML and the L-LATCH LL.

According to an example embodiment, the first cache unit CU may include a monitor transistor NM7. A source S of the monitor transistor NM7 may be connected to the combined sensing node SOC, and a cache monitoring signal MON_C may be applied to a gate of the monitor transistor NM7. Also, the cache unit CU may include a monitor transistor NM7 and the C-LATCH CL.

Figure 6:
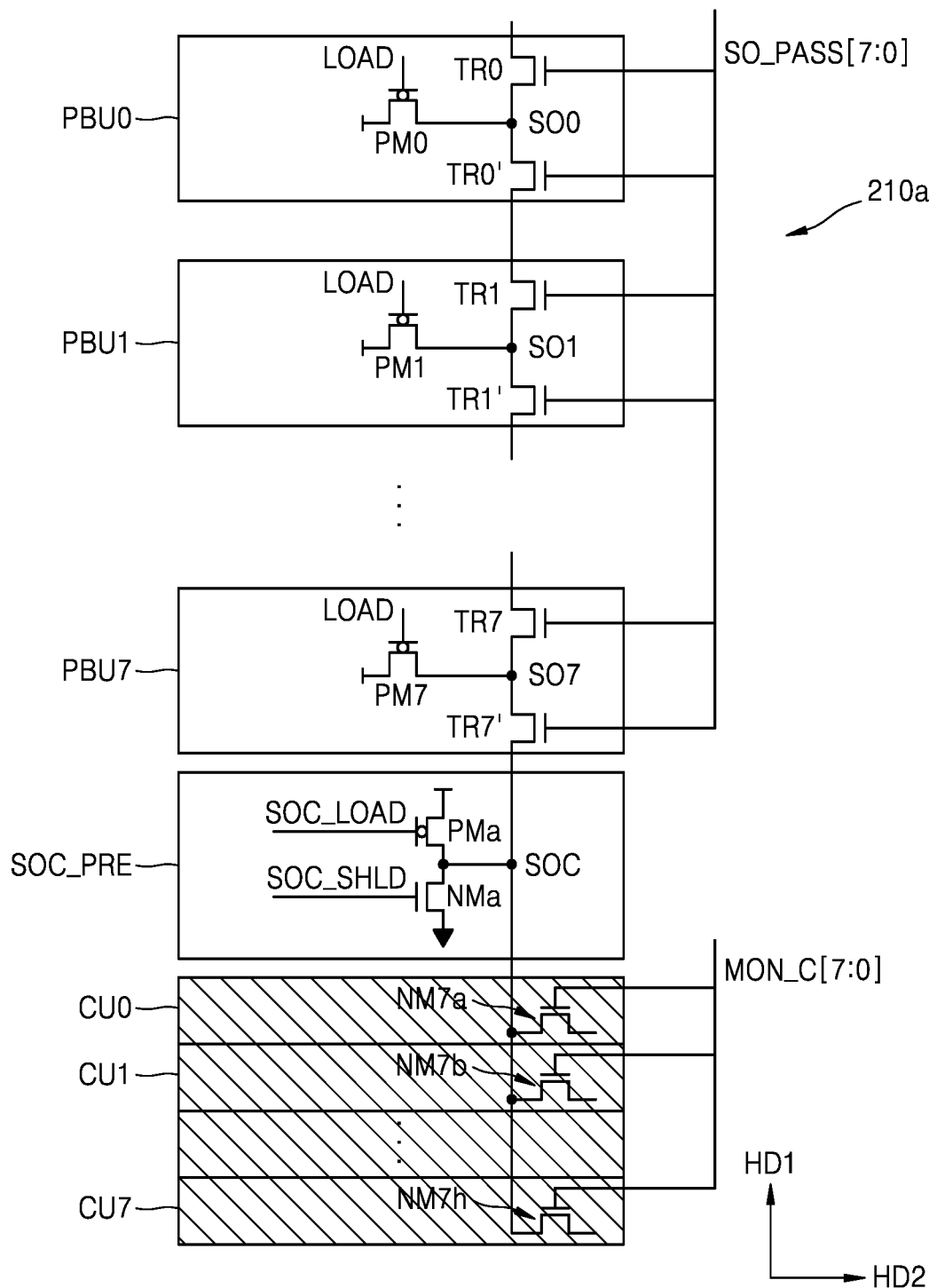
FIG. 6 is a circuit diagram of a page buffer circuit according to an example embodiment of the inventive concept.

FIG. 6 is a circuit diagram of a page buffer circuit 210a according to an example embodiment of the inventive concept.

Referring FIG. 6, the page buffer circuit 210a may include first to eighth page buffer units PBU0 to PBU7 provided in the first horizontal direction HD1 and first to eighth cache units CU0 to CU7 provided in the first horizontal direction HD1. For example, each of the first to eighth page buffer units PBU0 to PBU7 may be implemented to be substantially similar to the page buffer unit PBU of FIG. 5, each of the first to eighth cache units CU0 to CU7 may be implemented to be substantially similar to the cache unit CU of FIG. 5, and the description made above with reference to FIG. 5 may be applied to the example embodiment.

The first page buffer unit PBU0 may include first and second pass transistors TR0 and TR0' connected in series, and the second page buffer unit PBU1 may include first and second pass transistors TR1 and TR1' connected in series. A pass control signal SO_PASS [7:0] may be applied to gates of the first and second pass transistors TR0, TR0', TR1, and TR1'. According to the example embodiment, when the pass control signal SO_PASS[7:0] is activated, first and second pass transistors TR0 to TR7 and TR0' to TR7' may be turned on, and accordingly, the first and second pass transistors TR0 to TR7 and TR0' to TR7' respectively included in the first to eighth page buffer units PBU0 to PBU7 may be connected in series to each other, and all of first to eighth sensing nodes SO0 to SO7 may be connected to a combined sensing node SOC.

The first to eighth page buffer units PBU0 to PBU7 may further include precharge transistors PM0 to PM7, respectively. In the first page buffer unit PBU0, the precharge transistor PM0 may be connected between the first sensing node SO0 and a voltage terminal to which a precharge level is applied, and may have a gate to which the load signal LOAD is applied. The precharge transistor PM0 may precharge the first sensing node SO0 to the precharge level in response to the load signal LOAD.

The first cache unit CU0 may include a monitor transistor NM7a, and for example, the monitor transistor NM7a may correspond to the transistor NM7 of FIG. 5. A source S of the monitor transistor NM7a may be connected to the combined sensing node SOC, and a cache monitoring signal MON_C [7:0] may be respectively applied to a gate of the monitor transistors NM7a to NM7h. Monitor transistors NM7a to NM7h respectively included in the first to eighth cache units CU0 to CU7 may be commonly connected in parallel to the combined sensing node SOC. Particularly, respective sources of the monitor transistors NM7a to NM7h may be commonly connected to the combined sensing node SOC.

The page buffer circuit 210a may further include a precharge circuit SOC_PRE between the eighth page buffer unit PBU7 and the first cache unit CU0. The precharge circuit SOC_PRE may include a precharge transistor PMa for precharging the combined sensing node SOC, and a shielding transistor NMa. The precharge transistor PMa may be driven by a combined sensing node load signal SOC_LOAD, and when the precharge transistor PMa is turned on, the combined sensing node SOC may be precharged to the precharge level. The shielding transistor NMa may be driven by a combined sensing node shielding signal SOC_SHLD, and when the shielding transistor NMa is turned on, the combined sensing node SOC may be discharged to a ground level.

In a structure in which the first to eighth page buffer units PBU0 to PBU7 are separated from the first to eighth cache units CU0 to CU7, if eight signal lines are provided to respectively connect the first to eighth page buffer units PBU0 to PBU7 to the first to eighth cache units CU0 to CU7, a size of the page buffer circuit 210a in the second horizontal direction HD2 may increase. However, according to the example embodiment, the first to eighth sensing nodes SO0 to SO7 may be connected to each other by using the first and second pass transistors TR0 to TR7 and TR0' to TR7' respectively included in the first to eighth page buffer units PBU0 to PBU7, and the first to eighth sensing nodes SO0 to SO7 may be connected to the first to eighth cache units CU0 to CU7 through the combined sensing node SOC. By doing this, an increase in the size of the page buffer circuit 210a in the second horizontal direction HD2 may be prevented.

Figure 7:
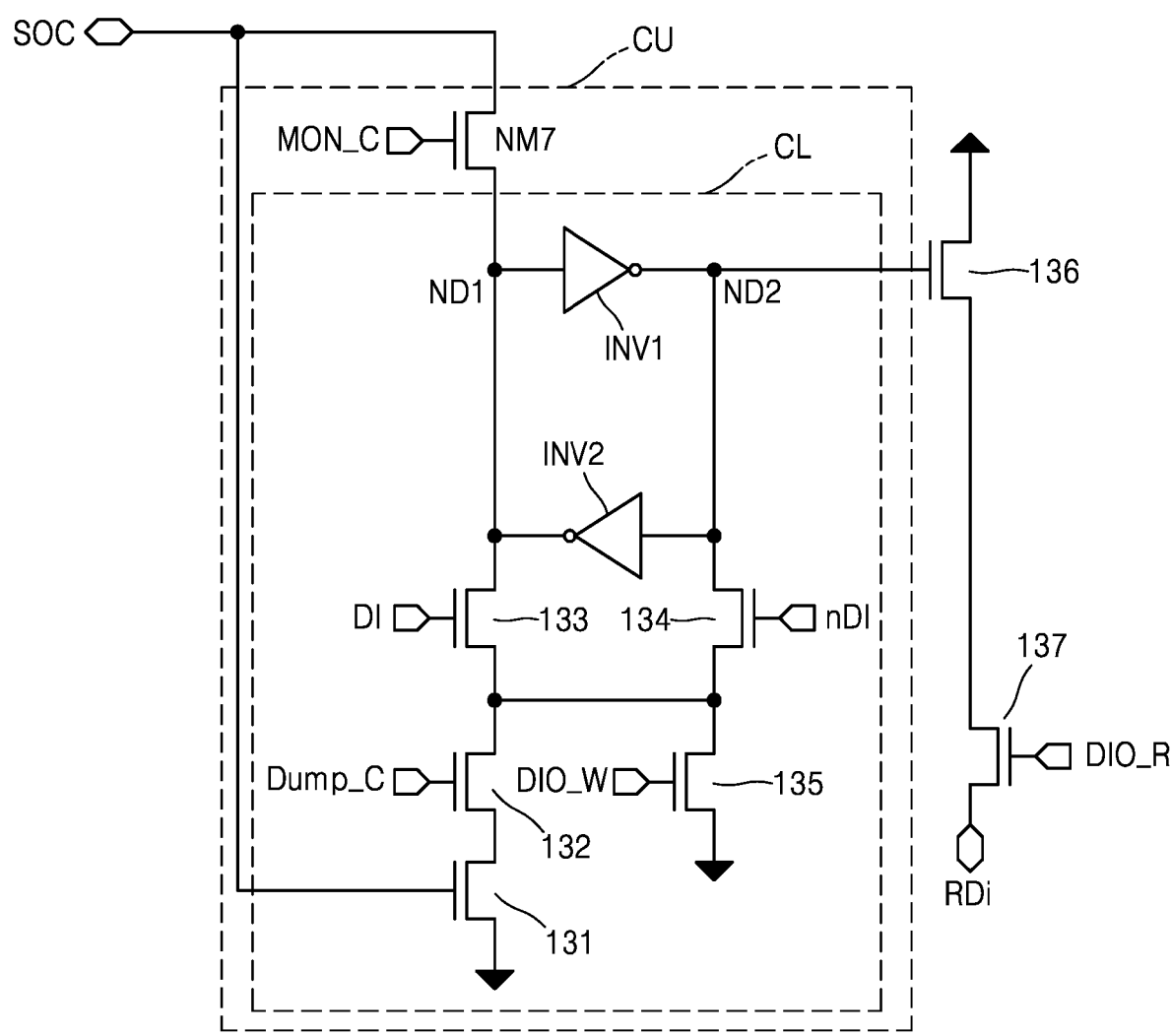
FIG. 7 is a circuit diagram of a cache unit according to an example embodiment of the inventive concept.

FIG. 7 is a circuit diagram of a cache unit CU according to an example embodiment of the inventive concept.

Referring to FIG. 7, the cache unit CU may include a monitor transistor NM7 and the C-LATCH CL, and the C-LATCH CL may include first and second inverters INV1 and INV2, a dump transistor 132, and transistors 131, 133, 134, and 135. The monitor transistor NM7 may be driven by a cache monitoring signal MON_C and may control a connection between the combined sensing node SOC and the C-LATCH CL.

The first inverter INV1 may be connected between a first node ND1 and a second node ND2, the second inverter INV2 may be connected between the second node ND2 and the first node ND1, and the first and second inverters INV1 and INV2 may form a latch. The transistor 131 has a gate connected to the combined sensing node SOC. The dump transistor 132 may be driven by a dump signal Dump_C and may transfer data stored in the C-LATCH CL to a main latch (i.e., one of the S-LATCH SL, the F-LATCH FL, the M-LATCH ML, or the L-LATCH LL) in a page buffer unit PBU. The transistor 133 may be driven by a data signal DI, the transistor 134 may be driven by an inverted data signal nDI, and the transistor 135 may be driven by a write control signal DIO_W. When the write control signal DIO_W is activated, voltage levels of the first and second nodes ND1 and ND2 may be determined according to the data signal DI and the inverted data signal nDI.

The cache unit CU may be connected to an input-output terminal RDi through transistors 136 and 137. The transistor 136 has a gate connected to the second node ND2 and may be turned on or off according to a voltage level of the second node ND2. The transistor 137 may be driven by a read control signal DIO_R. When the read control signal DIO_R is activated so that the transistor 137 is turned on, a voltage level of the input-output terminal RDi may be determined to be '1' or '0' according to a state of the C-LATCH CL.

Figure 8:
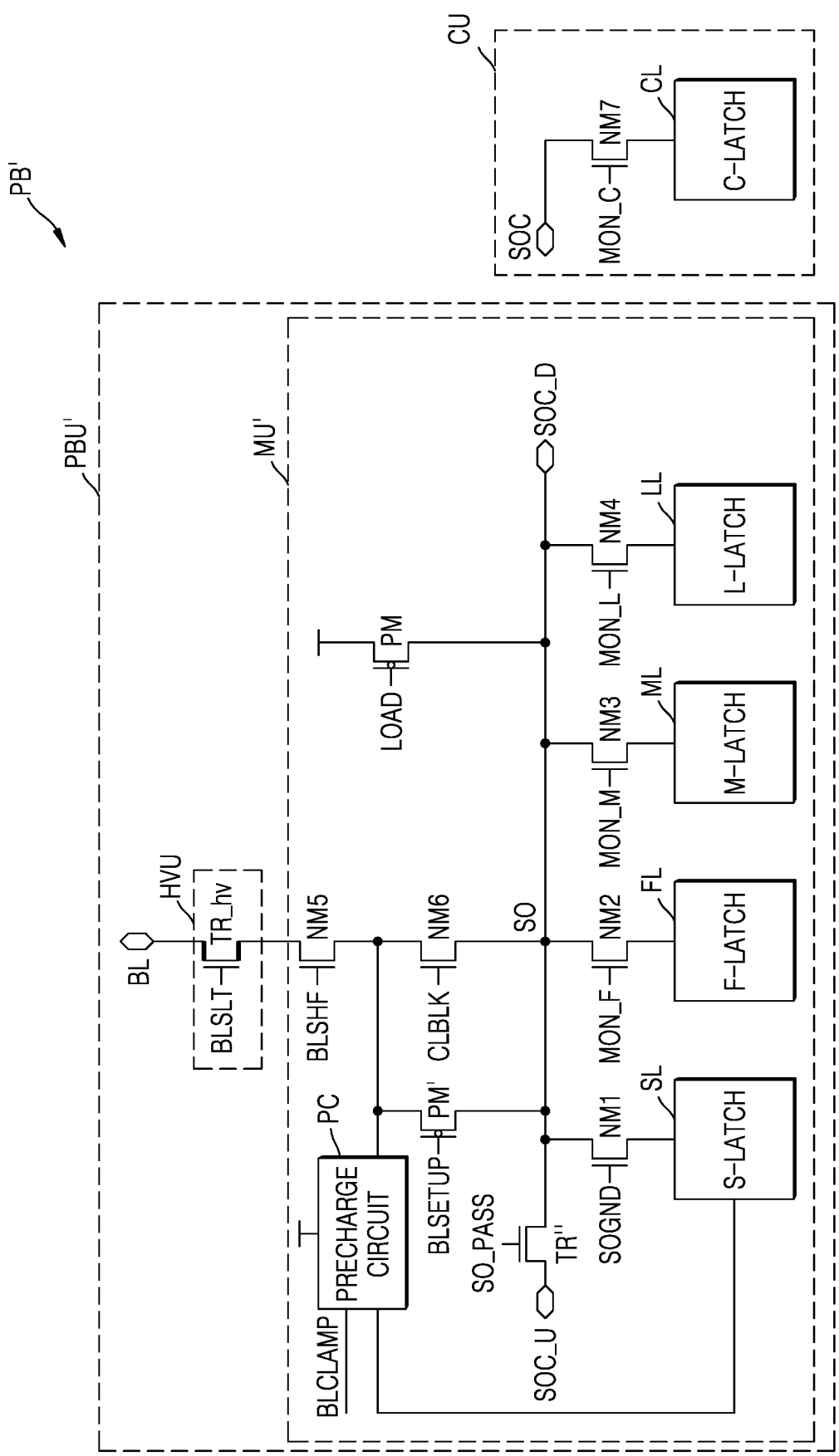
FIG. 8 is a circuit diagram of a page buffer according to an example embodiment of the inventive concept.

FIG. 8 is a circuit diagram of a page buffer PB' according to an example embodiment of the inventive concept.

Referring to FIG. 8, the page buffer PB' may include a page buffer unit PBU' and the cache unit CU, and the page buffer unit PBU' may include a main unit MU' and the high voltage unit HVU. The page buffer PB' may correspond to a modified example of the page buffer PB of FIG. 5, and the description made above with reference to FIGS. 5 to 7 may be applied to the example embodiment. The page buffer unit PBU of FIG. 5 includes the first and second transistors TR and TR', whereas the page buffer unit PBU' according to the example embodiment may include one pass transistor TR". The pass transistor TR" may be driven by the pass control signal SO_PASS and may be connected between the first terminal SOC_U and the second terminal SOC_D.

Figure 9:
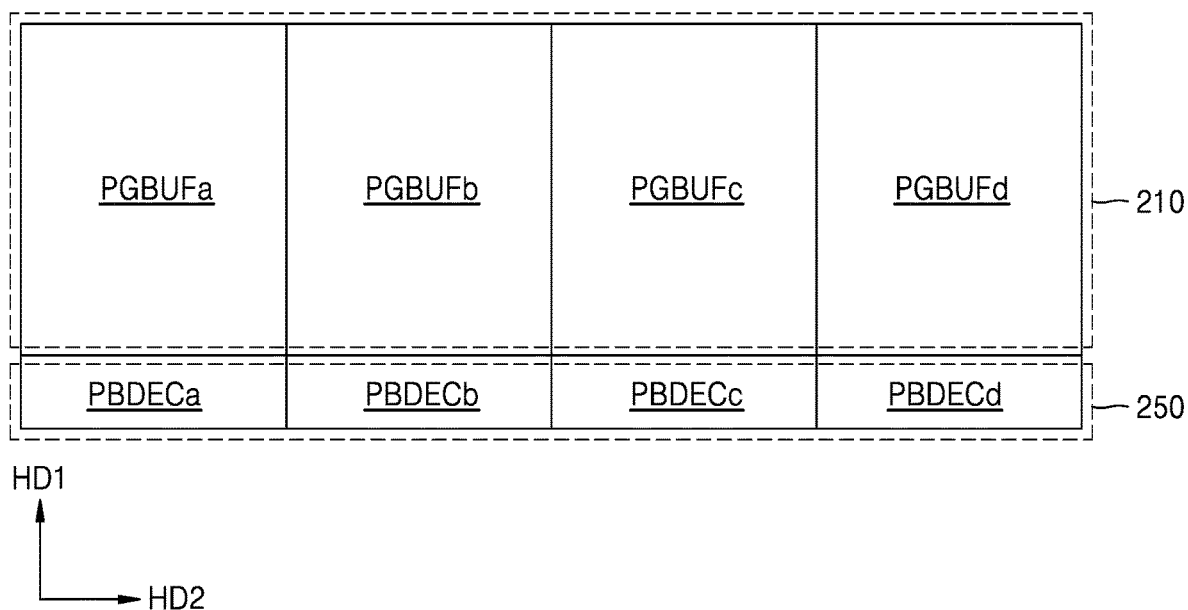
FIG. 9 is a block diagram of a page buffer circuit and a page buffer decoder according to an example embodiment of the inventive concept.

FIG. 9 is a block diagram of the page buffer circuit 210 and a page buffer decoder 250 according to an example embodiment of the inventive concept.

Referring to FIG. 9, the page buffer circuit 210 may include first to fourth page buffer circuits PGBUFa to PGBUFd provided in the second horizontal direction HD2, and for example, each of the first to fourth page buffer circuits PGBUFa to PGBUFd may be implemented to be the same as the page buffer circuit 210 of FIG. 6. As such, the page buffer circuit 210 may be implemented in the form of a page buffer array. However, the inventive concept is not limited thereto, and each of the first to fourth page buffer circuits PGBUFa to PGBUFd may include a plurality of page buffers, and each of the plurality of page buffers may be implemented to be the same as the page buffer PB' of FIG. 8.

The page buffer decoder 250 may be adjacent to the page buffer circuit 210 in the first horizontal direction HD1 and may include first to fourth page buffer decoders PBDECa to PBDECd provided in the second horizontal direction HD2. The first to fourth page buffer decoders PBDECa to PBDECd may be connected to the first to fourth page buffer circuits PGBUFa to PGBUFd, respectively. For example, the first page buffer decoder PBDECa may generate a decoder output signal corresponding to the number of fail bits from a page buffer signal received from the first page buffer circuit PGBUFa. For example, when the page buffer signal is logic low, a program for the corresponding memory cell may be determined as being failed and data programmed to the corresponding memory cell may be determined as a fail bit.

Figure 10:
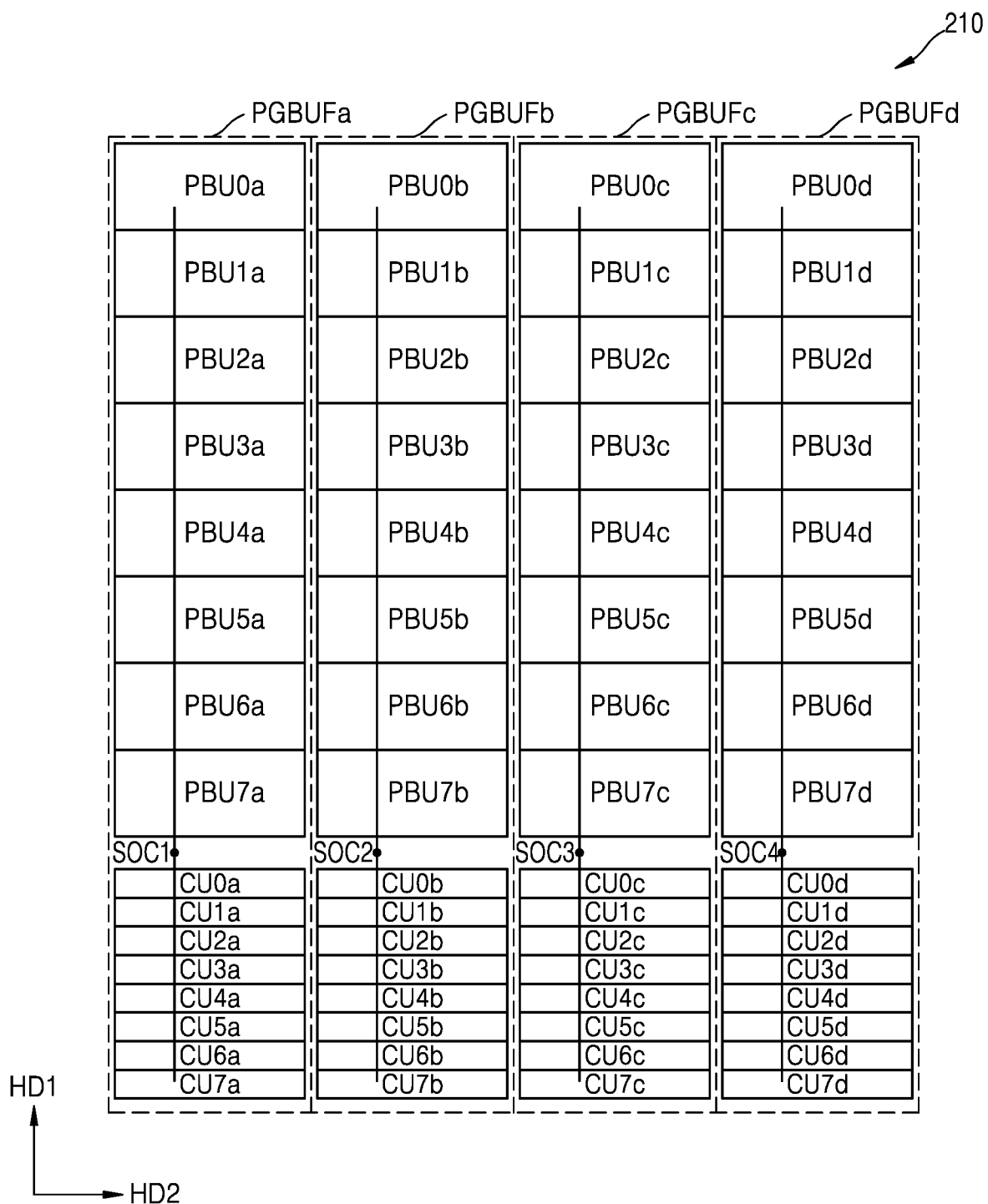
FIG. 10 is a block diagram of the page buffer circuit of FIG. 9, according to an example embodiment of the inventive concept.

FIG. 10 is a block diagram of the page buffer circuit 210 of FIG. 9, according to an example embodiment of the inventive concept.

Referring to FIG. 10, the first page buffer circuit PGBUFa may include page buffer units PBU0a to PBU7a and cache units CU0a to CU7a, respective sensing nodes of the page buffer units PBU0a to PBU7a may be commonly connected to a first combined sensing node SOC1, and the cache units CU0a to CU7a may be commonly connected to the first combined sensing node SOC1. The second page buffer circuit PGBUFb may include page buffer units PBU0b to PBU7b and cache units CU0b to CU7b, respective sensing nodes of the page buffer units PBU0b to PBU7b may be commonly connected to a second combined sensing node SOC2, and the cache units CU0b to CU7b may be commonly connected to the second combined sensing node SOC2. The third page buffer circuit PGBUFc may include page buffer units PBU0c to PBU7c and cache units CU0c to CU7c, respective sensing nodes of the page buffer units PBU0c to PBU7c may be commonly connected to a third combined sensing node SOC3, and the cache units CU0c to CU7c may be commonly connected to the third combined sensing node SOC3. The fourth page buffer circuit PGBUFd may include page buffer units PBU0d to PBU7d and cache units CU0d to CU7d, respective sensing nodes of the page buffer units PBU0d to PBU7d may be commonly connected to a fourth combined sensing node SOC4, and the cache units CU0d to CU7d may be commonly connected to the fourth combined sensing node SOC4.

Figure 11:
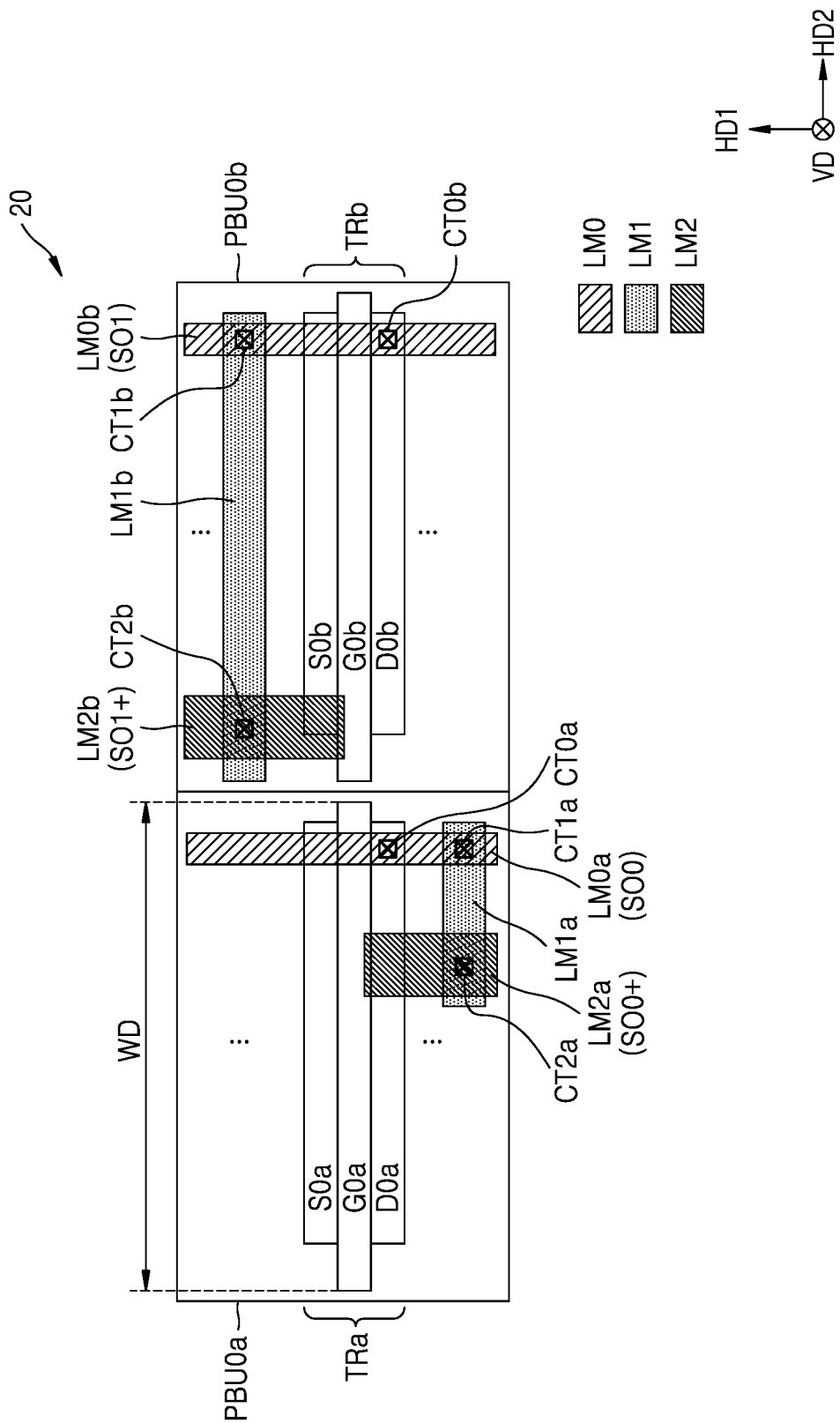
FIG. 11 is a top view of a page buffer circuit according to an example embodiment of the inventive concept.
Figure 12:
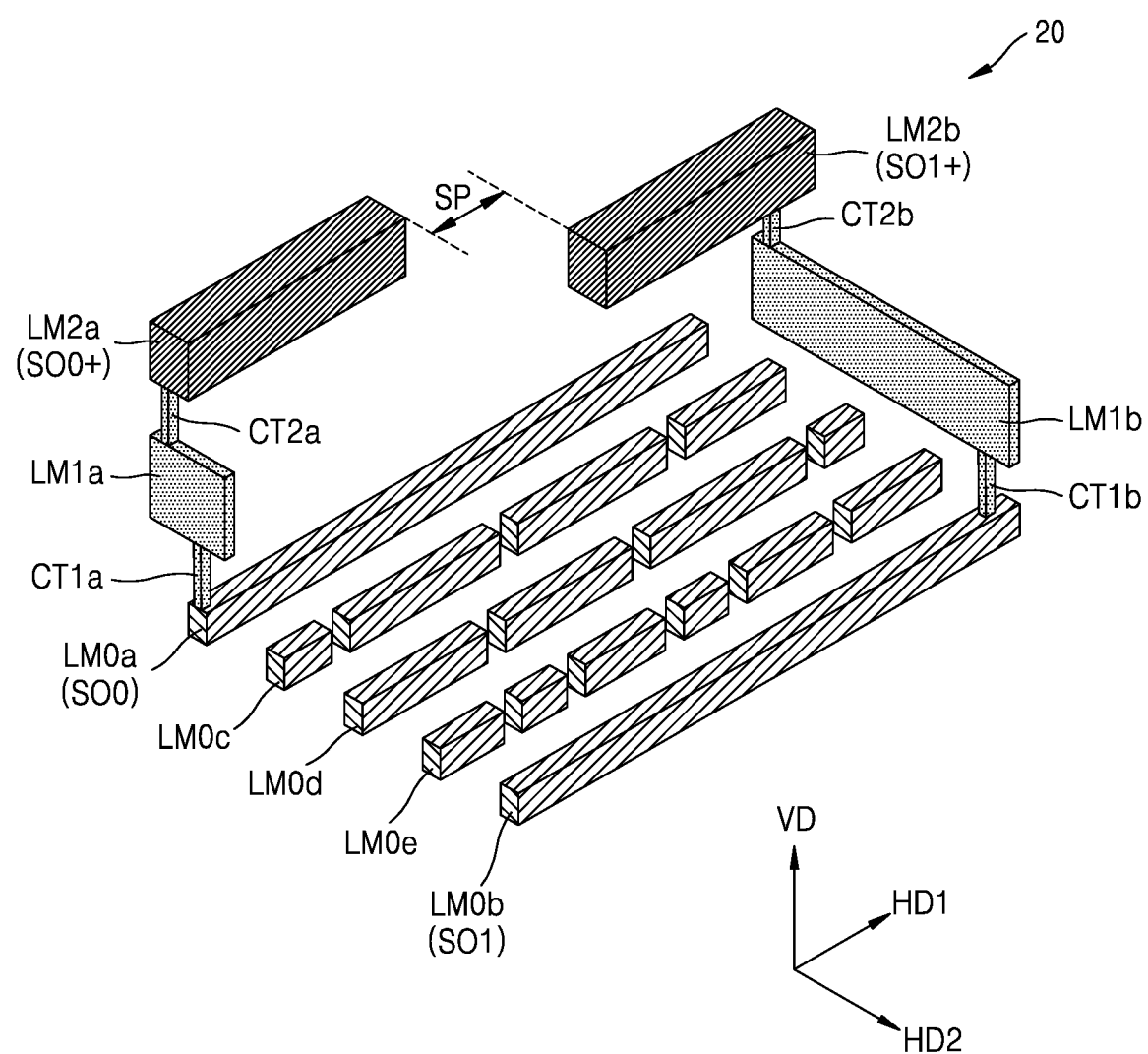
FIG. 12 is a perspective view of first to third metal layers of FIG. 11, according to an example embodiment of the inventive concept.

FIG. 11 is a top view of a page buffer circuit 20 according to an example embodiment of the inventive concept. FIG. 12 is a perspective view of first to third metal layers LM0 to LM2 of FIG. 11, according to an example embodiment of the inventive concept.

Referring to FIGS. 11 and 12, the page buffer circuit 20 may include first and second page buffer units PBU0a and PBU0b adjacent in the second horizontal direction HD2. The first page buffer unit PBU0a may include a transistor TRa, and the transistor TRa may include a source S0a, a gate G0a, and a drain D0a. The second page buffer unit PBU0b may include a transistor TRb, and the transistor TRb may include a source S0b, a gate G0b, and a drain D0b. For example, the transistors TRa and TRb may correspond to the pass transistor TR shown in FIG. 5 or the pass transistor TR" shown in FIG. 8, but the inventive concept is not limited thereto.

The first metal layer LM0, the second metal layer LM1, and the third metal layer LM2 may be provided above the page buffer circuit 20 in the vertical direction VD. For example, the first and third metal layers LM0 and LM2 may extend in the first horizontal direction HD1, and the second metal layer LM1 may extend in the second horizontal direction HD2. The first metal layer LM0 may include first metal patterns LM0a and LM0b, the second metal layer LM1 may include second metal patterns LM1a and LM1b, and the third metal layer LM2 may include third metal patterns LM2a and LM2b. For example, a pitch of the first metal patterns LM0a and LM0b may be less than a pitch of the third metal patterns LM2a and LM2b. For example, a thickness of the first metal patterns LM0a and LM0b in the vertical direction VD may be less than a thickness of the third metal patterns LM2a and LM2b in the vertical direction VD. According to an example embodiment, a "first metal layer" may be referred to as a "lower metal layer", a "third metal layer" may be referred to as an "upper metal layer", "first metal patterns" may be referred to as "lower metal patterns", and "third metal patterns" may be referred to as "upper metal patterns".

The first to third metal patterns LM0a, LM1a, and LM2a above the first page buffer unit PBU0a may be connected to each other, and accordingly, the first sensing node SO0 may be implemented. For example, the first metal pattern LM0a may be connected to the drain D0a of the transistor TRa through a contact CT0a, the second metal pattern LM1a may be connected to the first metal pattern LM0a through a contact CT1a, and the third metal pattern LM2a may be connected to the second metal pattern LM1a through a contact CT2a. In this case, the third metal pattern LM2a may be referred to as the first sensing node SO0 or a first sensing plus node SO0+. As described above, by using a plurality of metal layers to implement the first sensing node SO0, a total capacitance of the first sensing node SO0 may increase to have a sufficiently large value in a relationship with a sensing current so as to be robust to a change in a sensing condition. Therefore, in a read operation, a voltage variation of the first sensing node SO0 may decrease, and read reliability of the first sensing node SO0 may be improved.

The first to third metal patterns LM0b, LM1b, and LM2b above the second page buffer unit PBU0b may be connected to each other, and accordingly, the second sensing node SO1 may be implemented. For example, the first metal pattern LM0b may be connected to the drain D0b of the transistor TRb through a contact CT0b, the second metal pattern LM1b may be connected to the first metal pattern LM0b through a contact CT1b, and the third metal pattern LM2b may be connected to the second metal pattern LM1b through a contact CT2b. In this case, the third metal pattern LM2b may be referred to as the second sensing node SO1 or a second sensing plus node SO1+. As described above, by using a plurality of metal layers to implement the second sensing node SO1, a total capacitance of the second sensing node SO1 may increase to have a sufficiently large value in a relationship with a sensing current so as to be robust to a change in a sensing condition. Therefore, in a read operation, a voltage variation of the second sensing node SO1 may decrease, and read reliability of the second sensing node SO1 may be improved.

In an example embodiment, the third metal patterns LM2a and LM2b may not be adjacent in the second horizontal direction HD2. For example, the third metal patterns LM2a and LM2b may be separated by a first distance, that is, a first spacing SP in the first horizontal direction HD1. Accordingly, because coupling between the third metal patterns LM2a and LM2b may decrease, the voltage variation of the second sensing node SO1 may not affect a voltage of the first sensing node SO0, and accordingly, the read reliability of a memory device may be improved.

In an example embodiment, the first metal layer LM0 may further include first metal patterns LM0c, LM0d, and LM0e between the first metal patterns LM0a and LM0b. Each of the first metal patterns LM0c, LM0d, and LM0e may include a plurality of patterns separated from each other, and for example, the plurality of patterns may be connected to a plurality of transistors. For example, an internal power supply voltage or a ground voltage may be applied to the first metal pattern LM0c, and accordingly, the first metal pattern LM0a corresponding to the first sensing node SO0 may be shielded. In the example embodiment, a metal pattern to which the internal power supply voltage or the ground voltage is applied may be referred to as a "power supply pattern". In addition, for example, the internal power supply voltage or the ground voltage may be applied to the first metal pattern LM0e, and accordingly, the first metal pattern LM0b corresponding to the second sensing node SO1 may be shielded. As described above, according to the example embodiment, a voltage variation of each of the first and second sensing nodes SO0 and SO1 may be minimized by respectively disposing the first metal patterns LM0c and LM0e having a fixed bias voltage at one sides of the first metal patterns LM0a and LM0b respectively corresponding to the first and second sensing nodes SO0 and SO1.

According to a micro-process, an area of a region occupied by the page buffer circuit 20 is based on a transistor width WD. For example, the smaller a transistor width WD, the smaller an area of a region occupied by the page buffer circuit 20. For example, the transistor width WD may correspond to a size of the gate G0a of the transistor TRa in the second horizontal direction HD2. Particularly, the smaller the transistor width WD, the smaller a size of the first page buffer unit PBU0a in the second horizontal direction HD2. However, regardless of a decrease in the transistor width WD, a pitch of the first metal layer LM0 may not decrease. Accordingly, the number of wirings of the first metal layer LM0, i.e., the number of metal patterns, when the first page buffer unit PBU0a having a reduced size in the second horizontal direction HD2 may also decrease. For example, metal patterns of the first metal layer LM0 corresponding to the first page buffer unit PBU0a may be reduced from 6 to 4.

When the number of metal patterns of the first metal layer LM0 corresponding to the first page buffer unit PBU0a is reduced, the sensing reliability of the first page buffer unit PBU0a may decrease. For example, in a sensing operation, to prevent coupling between the first sensing node SO0 and an adjacent node, a metal pattern adjacent to the first sensing node SO0 may be used as a shielding line to which a fixed bias voltage is applied. However, when the metal pattern corresponding to the shielding line is removed due to the decrease in the metal patterns, a voltage variation of the first sensing node SO0 may increase due to coupling between the first sensing node SO0 and an adjacent node, and accordingly, the sensing reliability of the first page buffer unit PBU0a may decrease.

However, according to the example embodiment, by using a page buffer unit-cache unit separation structure, a degree of freedom of metal patterns included in the third metal layer LM2 above the first page buffer unit PBU0a may increase so that one of the metal patterns included in the third metal layer LM2 is used as the first sensing plus node SO0+. An increase in the voltage variation of the first sensing node SO0 may be prevented by connecting the first sensing node SO0 to the first sensing plus node SO0+, and accordingly, a decrease in the sensing reliability of the first page buffer unit PBU0a may be prevented.

Figure 13:
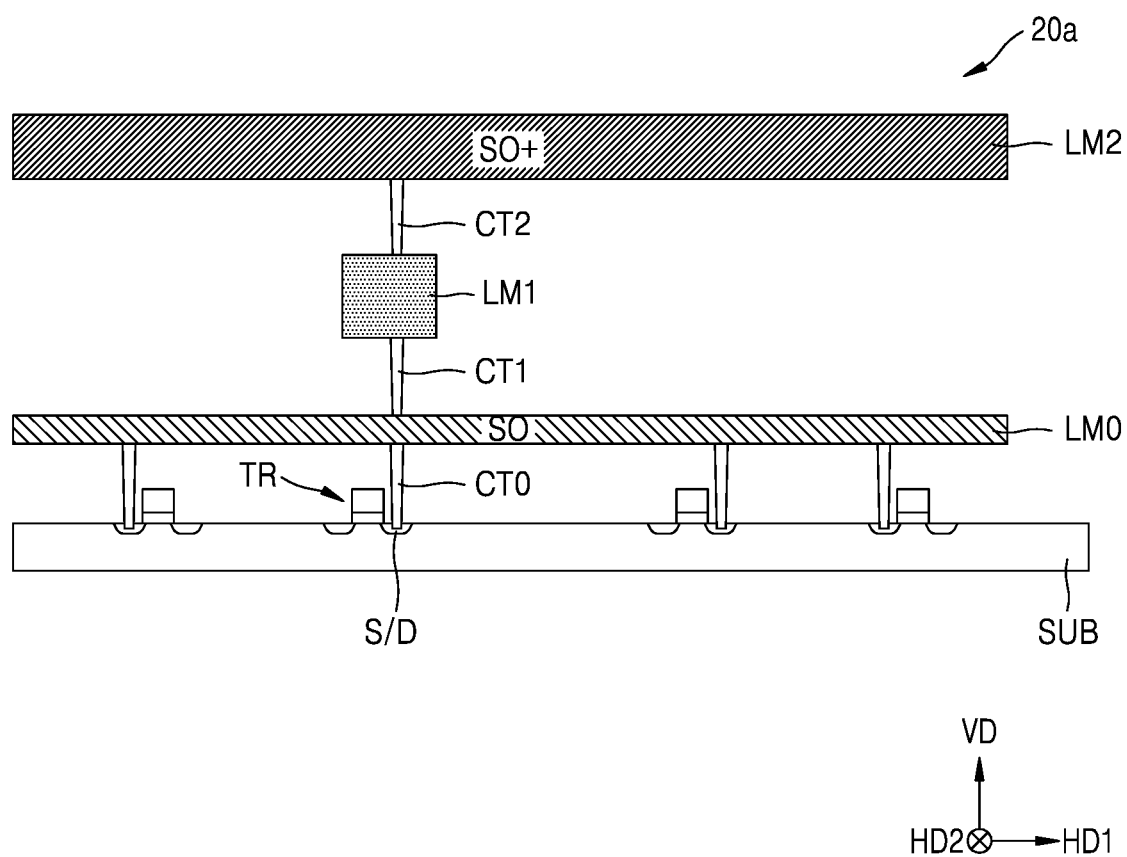
FIG. 13 is a cross-sectional view of a page buffer circuit according to an example embodiment of the inventive concept.

FIG. 13 is a cross-sectional view of a page buffer circuit 20a according to an example embodiment of the inventive concept.

Referring to FIG. 13, the page buffer circuit 20a corresponds to a modified example of the page buffer circuit 20 shown in FIG. 11, and the description made above with reference to FIGS. 11 and 12 may also be applied to the example embodiment. The page buffer circuit 20a may include a transistor TR on the substrate SUB. For example, the transistor TR may correspond to the pass transistor TR shown in FIG. 5 or the pass transistor TR" shown in FIG. 8, but the inventive concept is not limited thereto. The first metal layer LM0 may extend in the first horizontal direction HD1 and may be connected to a source/drain region S/D of the transistor TR through a contact CT0. The second metal layer LM1 may extend in the second horizontal direction HD2 and may be connected to the first metal layer LM0 through a contact CT1. The third metal layer LM2 may extend in the first horizontal direction HD1 and may be connected to the second metal layer LM1 through a contact CT2. As described above, according to the example embodiment, the third metal layer LM2 and the first metal layer LM0 may partially overlap in the vertical direction VD.

Figure 14:
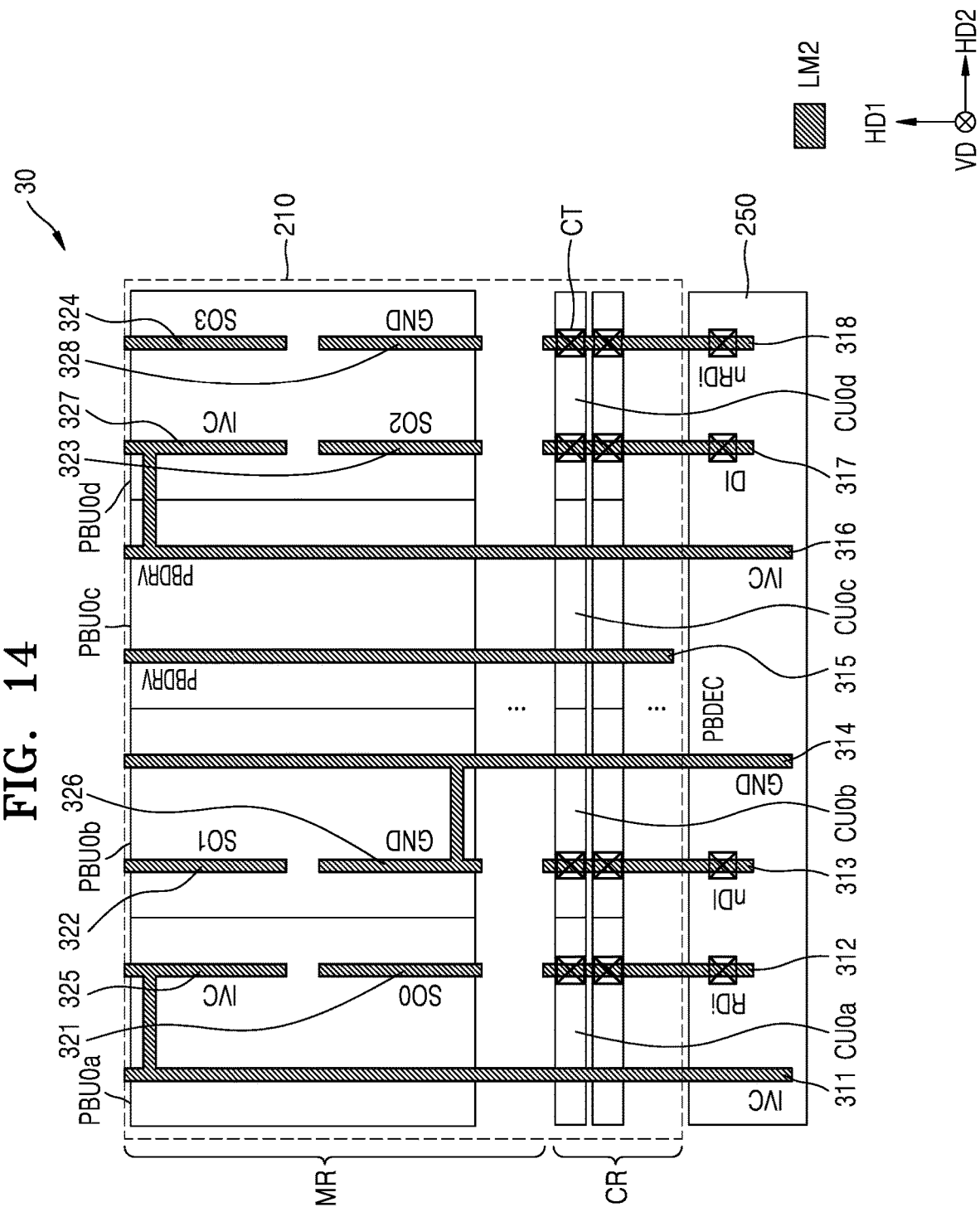
FIGS. 14 to 17 are layouts of the third metal layer according to some example embodiments of the inventive concept.

FIG. 14 is a layout 30 of the third metal layer LM2 above the page buffer circuit 210 and the page buffer decoder 250, according to an example embodiment of the inventive concept.

Referring to FIG. 14, the page buffer circuit 210 and the page buffer decoder 250 may be provided in the first horizontal direction HD1. The page buffer circuit 210 may be provided in a page buffer region including a main region MR and a cache region CR. A page buffer unit array including the page buffer units PBU0a to PBU0d may be provided on the main region MR, and a cache unit array including the cache units CU0a to CU0d may be provided on the cache region CR.

The third metal layer LM2 may include metal patterns 311 to 318 and 321 to 328 extending in the first horizontal direction HD1 and may be provided above the page buffer circuit 210 and the page buffer decoder 250 in the vertical direction VD. For example, the third metal layer LM2 may correspond to the third metal layer LM2 of FIGS. 11 to 13. The metal patterns 311, 314, and 316 may be provided above the main region MR, the cache region CR, and the page buffer decoder 250 by crossing the same, and the metal pattern 315 may be provided above the main region MR and the cache region CR by crossing the same. For example, an internal power supply voltage IVC may be applied to the metal patterns 311 and 316, a ground voltage GND may be applied to the metal pattern 314, and a first page buffer driver signal PBDRV may be applied to the metal pattern 315.

The metal patterns 312, 313, 317, and 318 may be provided above the cache region CR and the page buffer decoder 250 by crossing the same. The metal patterns 312, 313, 317, and 318 may be electrically connected to the cache units CU0a to CU0d and the page buffer decoder 250 through contacts CT. The metal patterns 321 to 328 may be provided above the main region MR by crossing the same.

As described above with reference to FIG. 10, the page buffer circuit 210 may have a page buffer unit-cache unit separation structure. For example, in the page buffer circuit 210, the metal patterns 312, 313, 317, and 318 to which signals associated with the cache units CU0a to CU0d are applied may be provided above the cache region CR and the page buffer decoder 250 by crossing the same and may not extend to the main region MR. For example, the metal patterns 312 and 318 may respectively correspond to the input-output terminal RDi and an inverted input-output terminal nRDi, and the inverted data signal nDI and the data signal DI may be respectively applied to the metal patterns 313 and 317.

According to the page buffer unit-cache unit separation structure, a degree of wiring freedom of the third metal layer LM2 above the main region MR in which the page buffer units PBU0a to PBU0d are provided may increase. Accordingly, some metal patterns 321 to 324 of the third metal layer LM2 above the main region MR may be used as the first to fourth sensing nodes SO0 to SO3 of the page buffer units PBU0a to PBU0d, respectively. Particularly, the first to fourth sensing nodes SO0 to SO3 may be implemented by metal patterns included in the first metal layer LM0, the metal patterns included in the first metal layer LM0 may be electrically connected to the metal patterns 321 to 324 included in the third metal layer LM2, respectively, and accordingly, a capacitance of each of the first to fourth sensing nodes SO0 to SO3 may increase.

Figure 15:
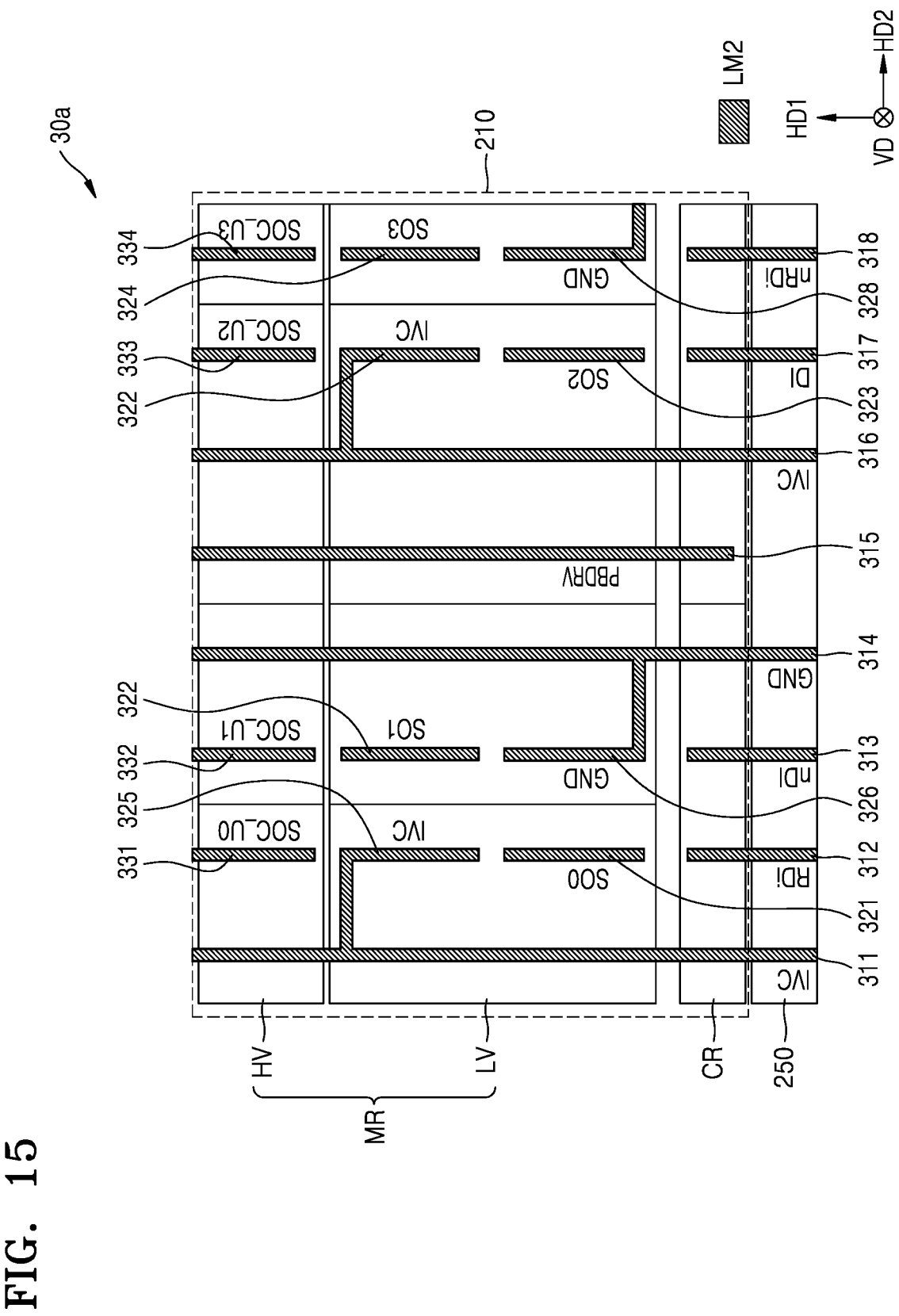

FIG. 15 is a layout 30a of the third metal layer LM2 according to an example embodiment of the inventive concept.

Referring to FIG. 15, the layout 30a corresponds to a modified example of the layout 30 of FIG. 14, and a duplicated description is omitted. In the cache region CR, for example, the first to eighth cache units CU0 to CU7 of FIG. 6 may be provided. The main region MR may include a low voltage region LV and a high voltage region HV. For example, in the low voltage region LV, the main unit MU of FIG. 5 or the main unit MU' of FIG. 8 may be provided, and in the high voltage region HV, the high voltage unit HVU of FIG. 5 or 8 may be provided. Although FIG. 15 shows one low voltage region LV and one high voltage region HV for convenience, the inventive concept is not limited thereto, and for example, a plurality of low voltage regions and a plurality of high voltage regions respectively corresponding to the first to eighth cache units PBU0 to PBU7 may be provided in the first horizontal direction HD1. Page buffer units in the main region MR may be connected to a column driver, and the column driver may provide gate driving voltages to be applied to gates of transistors included in the page buffer units, respectively.

The third metal layer LM2 may include metal patterns 311 to 318, 321 to 328, and 331 to 334 extending in the first horizontal direction HD1. The metal patterns 311, 314, and 316 may be provided above the main region MR, the cache region CR, and the page buffer decoder 250 by crossing the same, and the metal pattern 315 may be provided above the main region MR and the cache region CR by crossing the same. For example, a first page buffer driver signal PBDRV may be applied to the metal pattern 315, and the metal pattern 315 may be connected to the column driver. The metal patterns 331 to 334 may be provided above the high voltage region HV of the page buffer circuit 210 in the vertical direction VD. For example, the metal patterns 331 to 334 may correspond to first to fourth nodes SOC_U0 to SOC_U3, respectively. For example, one of the first to fourth nodes SOC_U0 to SOC_U3 may correspond to the first terminal SOC_U of FIG. 5 or 8.

Figure 16:
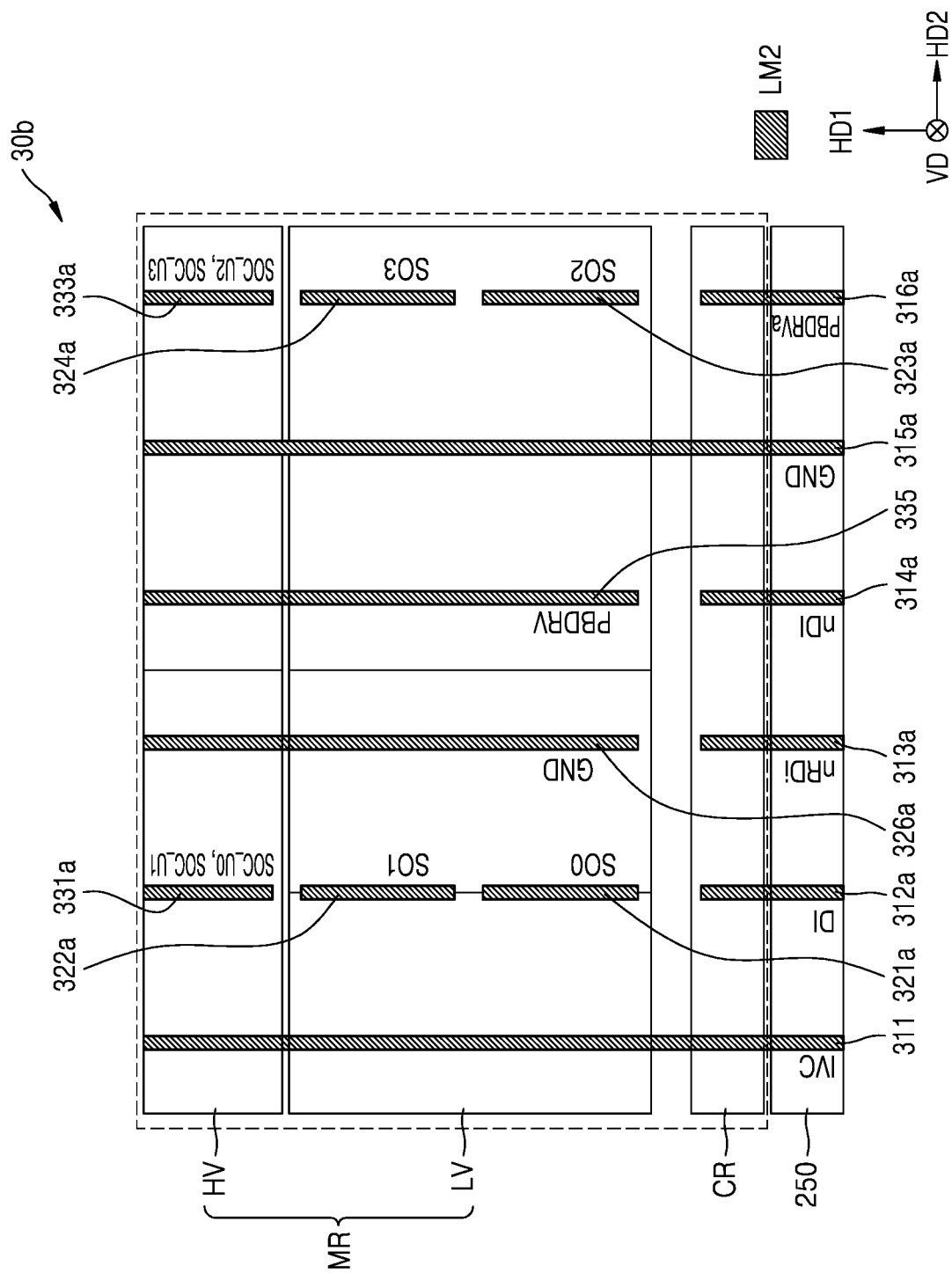

FIG. 16 is a layout 30b of the third metal layer LM2 according to an example embodiment of the inventive concept.

Referring to FIG. 16, the layout 30b corresponds to a modified example of the layout 30a of FIG. 15, and a duplicated description is omitted. The third metal layer LM2 may include metal patterns 311, 312a to 316a, 321a to 324a, 326a, 331a, 333a, and 335 extending in the first horizontal direction HD1. The metal patterns 311 and 315a may be provided above the main region MR, the cache region CR, and the page buffer decoder 250 by crossing the same. For example, the internal power supply voltage IVC and the ground voltage GND may be applied to the metal patterns 311 and 315a, respectively.

The metal patterns 321a to 324a may be provided above the low voltage region LV in the vertical direction VD and may correspond to, for example, the first to fourth sensing nodes SO0 to SO3, respectively. The metal patterns 321a and 322a may be provided in a line in the first horizontal direction HD1, and the metal patterns 323a and 324a may be provided in a line in the first horizontal direction HD1. The metal pattern 326a may be provided above the main region MR in the vertical direction VD, and for example, the ground voltage GND may be applied to the metal pattern 326a. The metal pattern 335 may be provided above the main region MR in the vertical direction VD, for example, the first page buffer driver signal PBDRV may be applied to the metal pattern 335, and the metal pattern 335 may be connected to a first column driver. The metal pattern 316a may be provided above the cache region CR and the page buffer decoder 250 in the vertical direction VD, for example, a second page buffer driver signal PBDRVa may be applied to the metal pattern 316a, and the metal pattern 316a may be connected to a second column driver. The metal patterns 331a and 333a may be provided above the high voltage region HV in the vertical direction VD. For example, the metal pattern 331a may correspond to the first and second nodes SOC_U0 and SOC_U1, and the metal pattern 333a may correspond to the third and fourth nodes SOC_U2 and SOC_U3.

Figure 17:
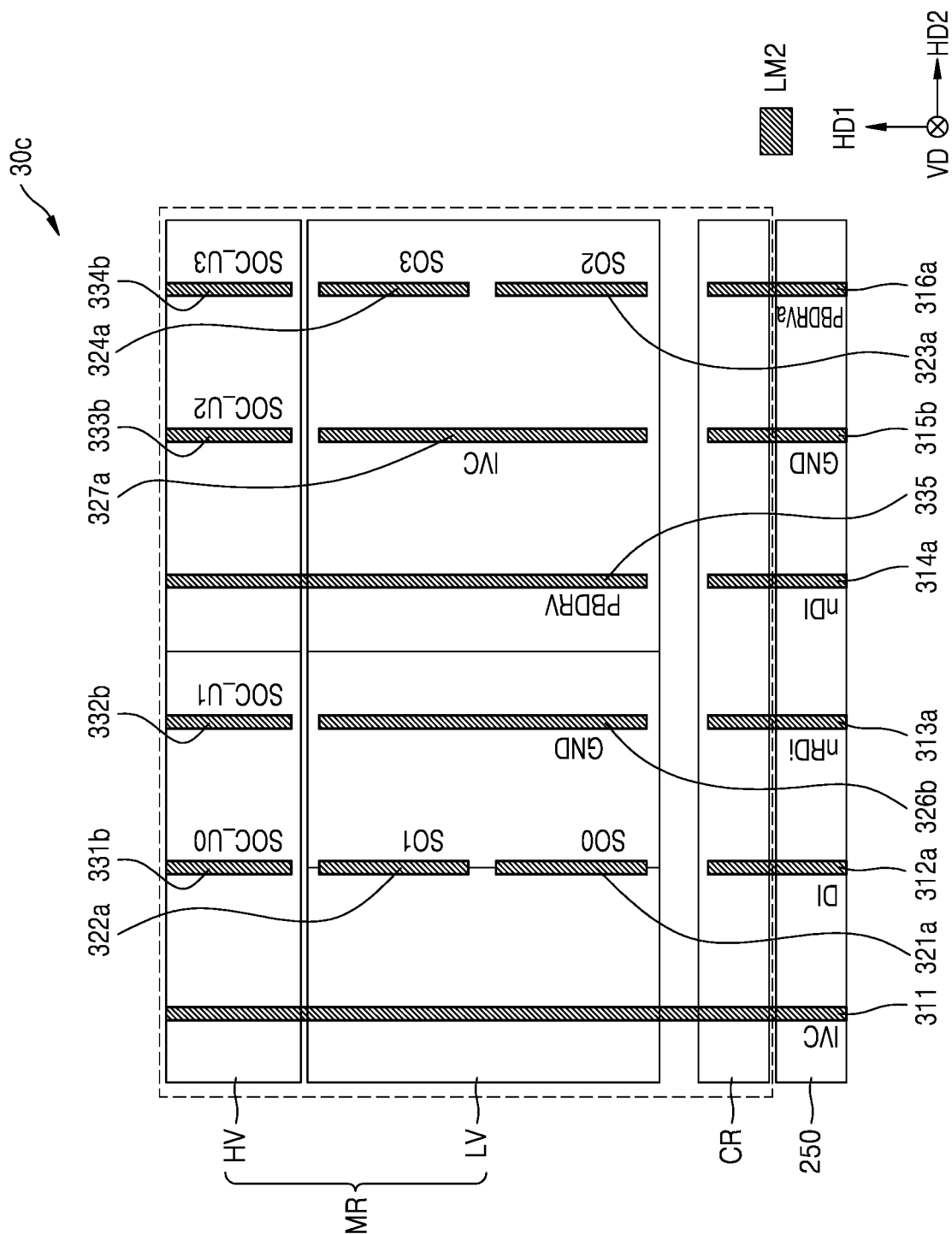

FIG. 17 is a layout 30c of the third metal layer LM2 according to an example embodiment of the inventive concept.

Referring to FIG. 17, the layout 30c corresponds to a modified example of the layout 30b of FIG. 16, and a duplicated description is omitted. The third metal layer LM2 may include metal patterns 311, 312a to 314a, 315b, 316a, 321a to 324a, 326b, 327a, and 331b to 334b extending in the first horizontal direction HD1. The metal pattern 315b may be provided above the cache region CR and the page buffer decoder 250 in the vertical direction VD, and for example, the ground voltage GND may be applied to the metal pattern 315b. The metal patterns 326b and 327a may be provided above the low voltage region LV in the vertical direction VD, and for example, the ground voltage GND and the internal power supply voltage IVC may be applied to the metal patterns 326b and 327a, respectively. The metal patterns 331b to 334b may be provided above the high voltage region HV in the vertical direction VD and may correspond to, for example, the first to fourth nodes SOC_U0 to SOC_U3, respectively.

Figure 18:
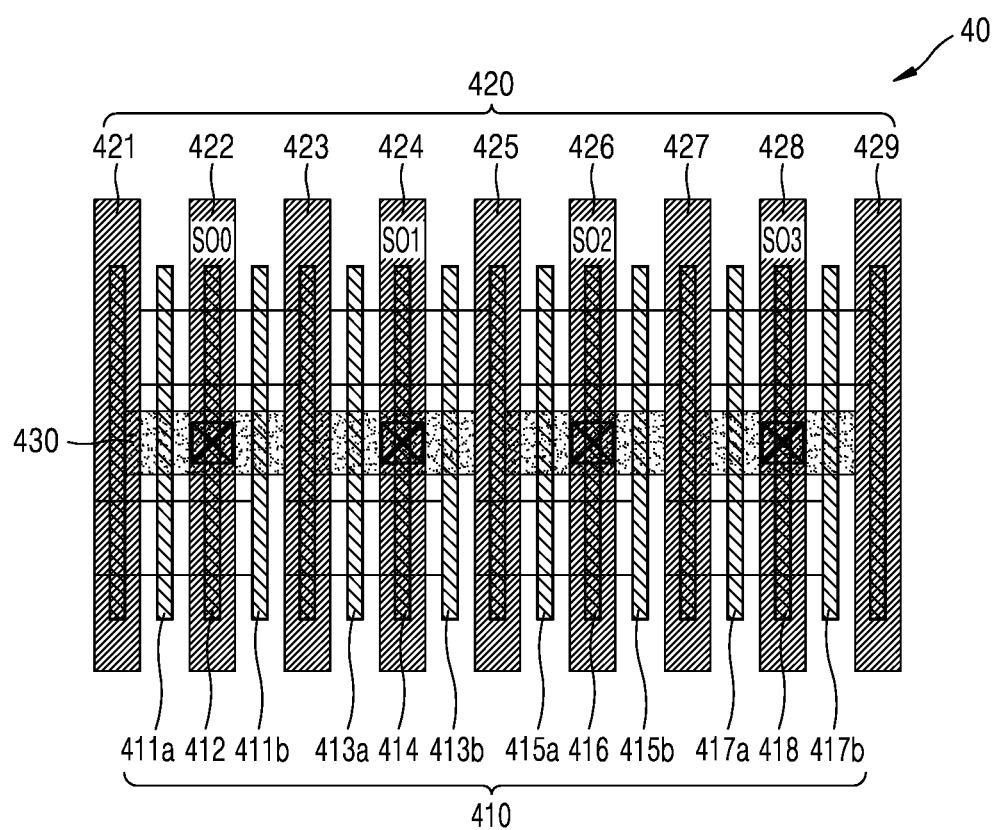
FIG. 18 is a top view of a page buffer circuit according to an example embodiment of the inventive concept.

FIG. 18 is a top view of a page buffer circuit 40 according to an example embodiment of the inventive concept.

Referring to FIG. 18, the page buffer circuit 40 may include a lower metal layer 410 including lower metal patterns 411a, 411b, 412, 413a, 413b, 414, 415a, 415b, 416, 417a, 417b and 418, an upper metal layer 420 including upper metal patterns 421 to 429, and a plurality of active regions 430. For example, the plurality of active regions 430 may include source/drain regions of transistors included in a page buffer unit. As illustrated in FIG. 18, a pitch of the lower metal patterns is smaller than a pitch of the upper metal patterns. For example, according to an example embodiment, a distance between adjacent patterns of the lower metal patterns is smaller than a distance between adjacent patterns of the upper metal patterns.

The lower metal patterns 411*a* to 418 may be provided above the plurality of active regions 430 in the vertical direction VD and may extend in the first horizontal direction HD1. For example, the lower metal patterns 412, 414, 416, and 418 may correspond to the first to fourth sensing nodes SO0 to SO3, respectively. The upper metal patterns 421 to 429 may be provided above the lower metal layer 410 in the vertical direction VD and may extend in the first horizontal direction HD1. For example, the upper metal patterns 422, 424, 426, and 428 may be connected to the lower metal patterns 412, 414, 416, and 418 through contacts CT, respectively, and accordingly, the upper metal patterns 422, 424, 426, and 428 may correspond to the first to fourth sensing nodes SO0 to SO3, respectively.

For example, the internal power supply voltage or the ground voltage may be applied to the lower metal patterns 411*a* and 411*b* at both sides of the lower metal pattern 412 corresponding to the first sensing node SO0, and accordingly, the lower metal patterns 411*a* and 411*b* may be used as shielding lines for the lower metal pattern 412. Likewise, the lower metal patterns 413*a* and 413*b* may be used as shielding lines for the lower metal pattern 414, the lower metal patterns 415*a* and 415*b* may be used as shielding lines for the lower metal pattern 416, and the lower metal patterns 417*a* and 417*b* may be used as shielding lines for the lower metal pattern 418. In addition, for example, the internal power supply voltage or the ground voltage may be applied to the upper metal patterns 421, 423, 425, and 427, and accordingly, the upper metal patterns 421, 423, 425, and 427 may be used as shielding lines for the upper metal patterns 422, 424, 426, and 428, respectively.

Figure 19:
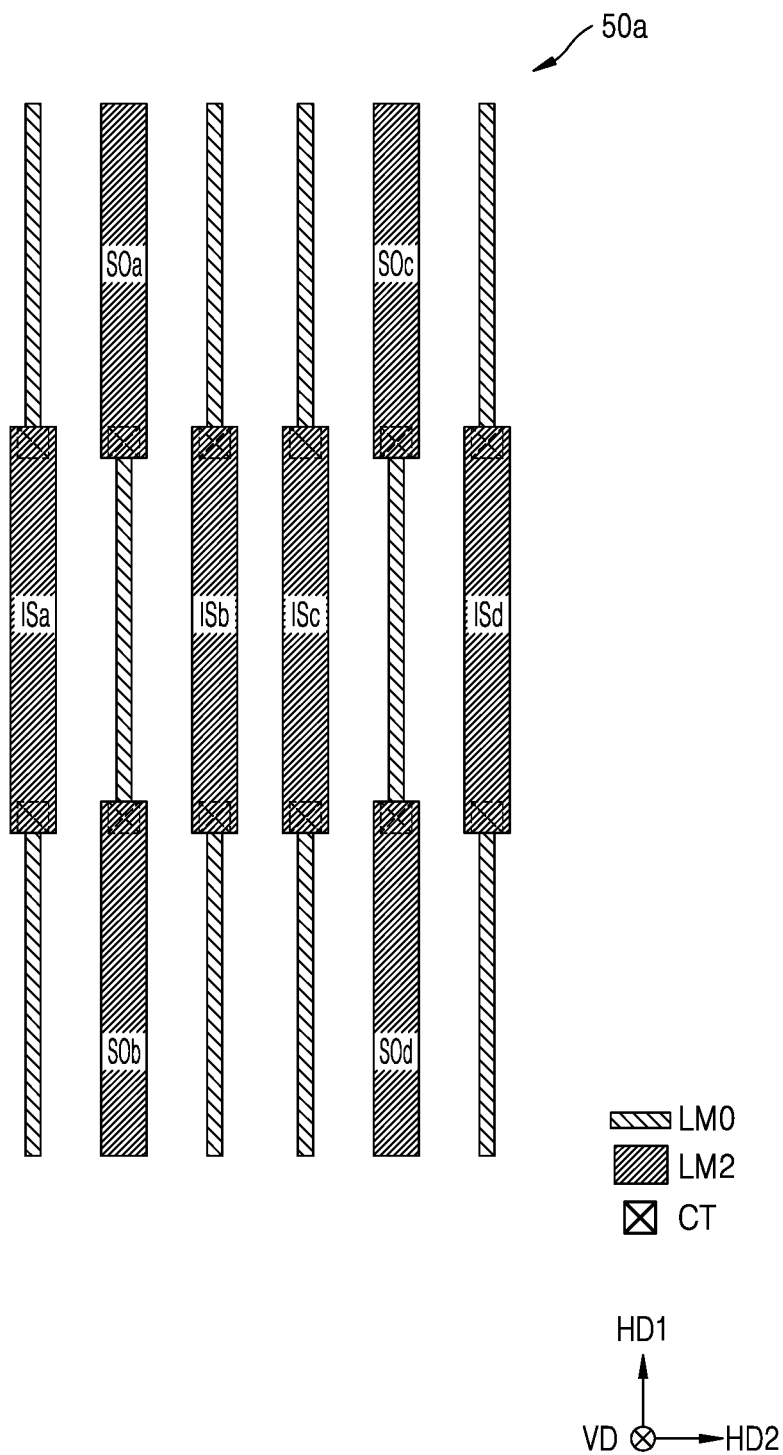
FIGS. 19 to 22 are layouts of the first to third metal layers according to some example embodiments of the inventive concept.

FIG. 19 is a layout 50*a* of the first and third metal layers LM0 and LM2 according to an example embodiment of the inventive concept.

Referring to FIG. 19, the first and third metal layers LM0 and LM2 may extend in the first horizontal direction HD1, and the third metal layer LM2 may be provided above the first metal layer LM0 in the vertical direction VD and may be connected to the first metal layer LM0 through the contact CT. The third metal layer LM2 may include first to fourth sensing node patterns SOa to SOd and first to fourth internal signal patterns ISa to ISd. For example, signals applied to a sensing latch may be applied to the first to fourth internal signal patterns ISa to ISd, respectively. The first to fourth sensing node patterns SOa to SOd may not be adjacent to each other in the second horizontal direction HD2. For example, the first to fourth sensing node patterns SOa to SOd and the first to fourth internal signal patterns ISa to ISd may be alternately provided in the second horizontal direction HD2.

Hereinafter, patterns on a plurality of tracks, e.g., first to sixth tracks, of the third metal layer LM2 will be described. For example, the first internal signal pattern ISa may be provided on the first track, the first and second sensing node patterns SOa and SOb may be provided on the second track, the second internal signal pattern ISb may be provided on the third track, the third internal signal pattern ISc may be provided on the fourth track, the third and fourth sensing node patterns SOc and SOd may be provided on the fifth track, and the fourth internal signal pattern ISd may be provided on the sixth track.

Figure 20:
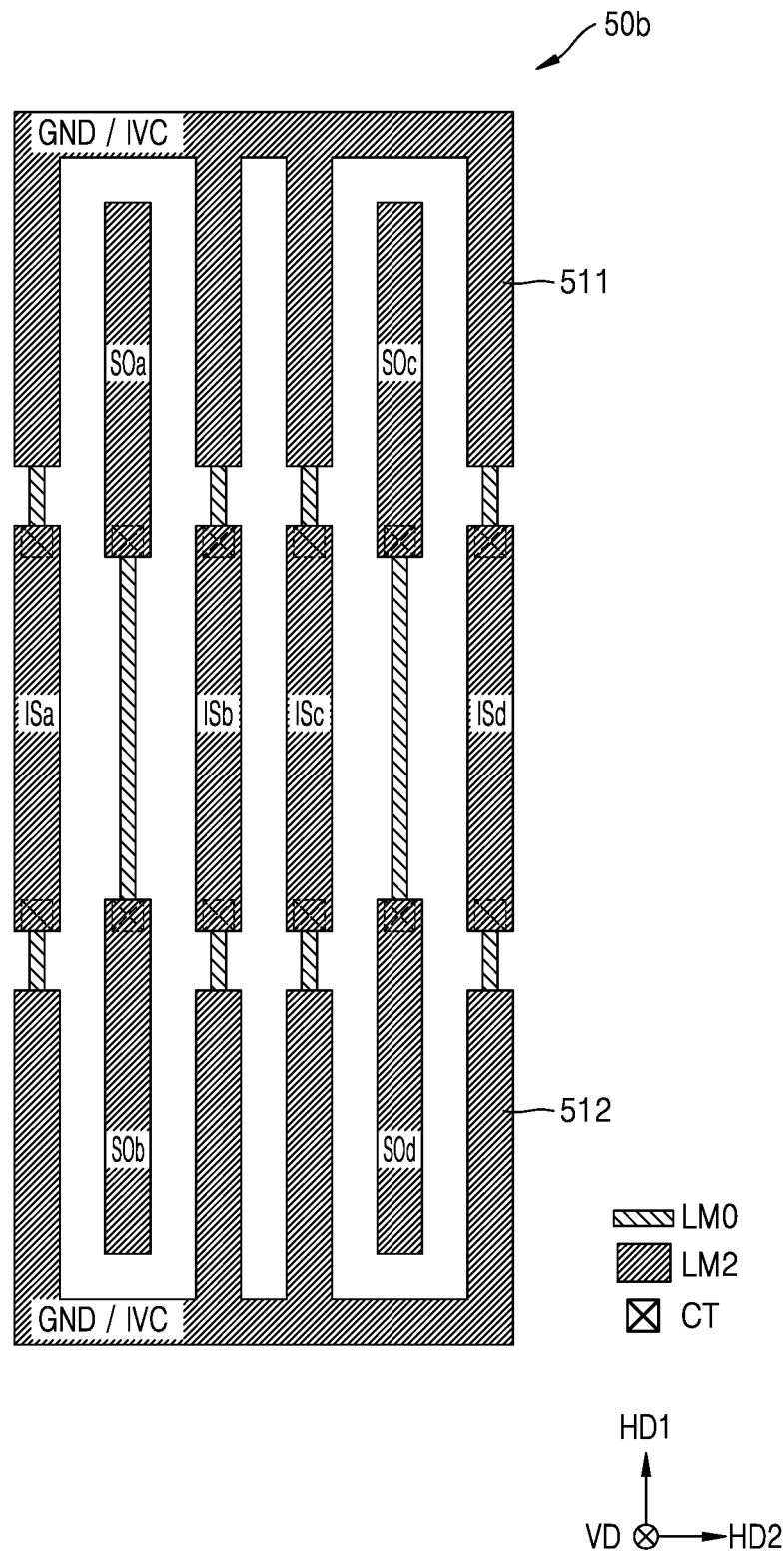

FIG. 20 is a layout 50*b* of the first and third metal layers LM0 and LM2 according to an example embodiment of the inventive concept.

Referring to FIG. 20, the layout 50*b* corresponds to a modified example of the layout 50*a* of FIG. 19, and a duplicated description is omitted. The third metal layer LM2 may further include metal patterns 511 and 512 to which the ground voltage GND or the internal power supply voltage IVC is respectively applied. The metal patterns 511 and 512 may be used as shielding lines for the first to fourth sensing node patterns SOa to SOd. For example, the metal pattern 511 may include vertical-direction patterns on the first, third, fourth, and sixth tracks and a horizontal-direction pattern connecting the vertical-direction patterns and may be used as shielding lines for the first and third sensing node patterns SOa and SOc. For example, the metal pattern 512 may include vertical-direction patterns on the first, third, fourth, and sixth tracks and a horizontal-direction pattern connecting the vertical-direction patterns and may be used as shielding lines for the second and fourth sensing node patterns SOb and SOd.

Figure 21:
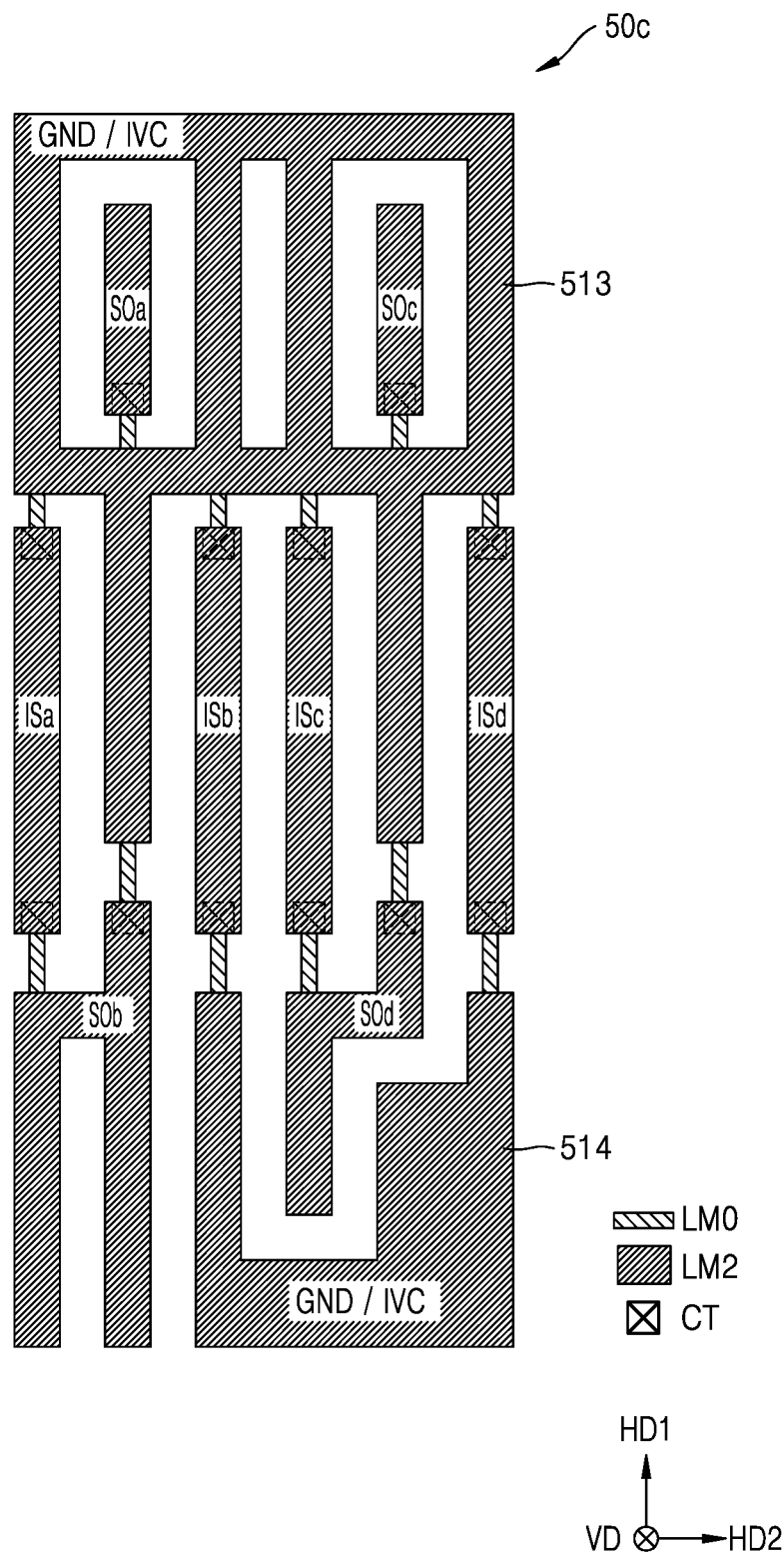

FIG. 21 is a layout 50*c* of the first and third metal layers LM0 and LM2 according to an example embodiment of the inventive concept. Referring to FIG. 21, the layout 50*c* corresponds to a modified example of the layout 50*b* of FIG. 20, and a duplicated description is omitted. The third metal layer LM2 may further include metal patterns 513 and 514 to which the ground voltage GND or the internal power supply voltage IVC is respectively applied. The metal patterns 513 and 514 may be used as shielding lines for the first to fourth sensing node patterns SOa to SOd. In addition, the metal pattern 513 may also be used as shielding lines for the first to fourth internal signal patterns ISa to ISd.

Figure 22:
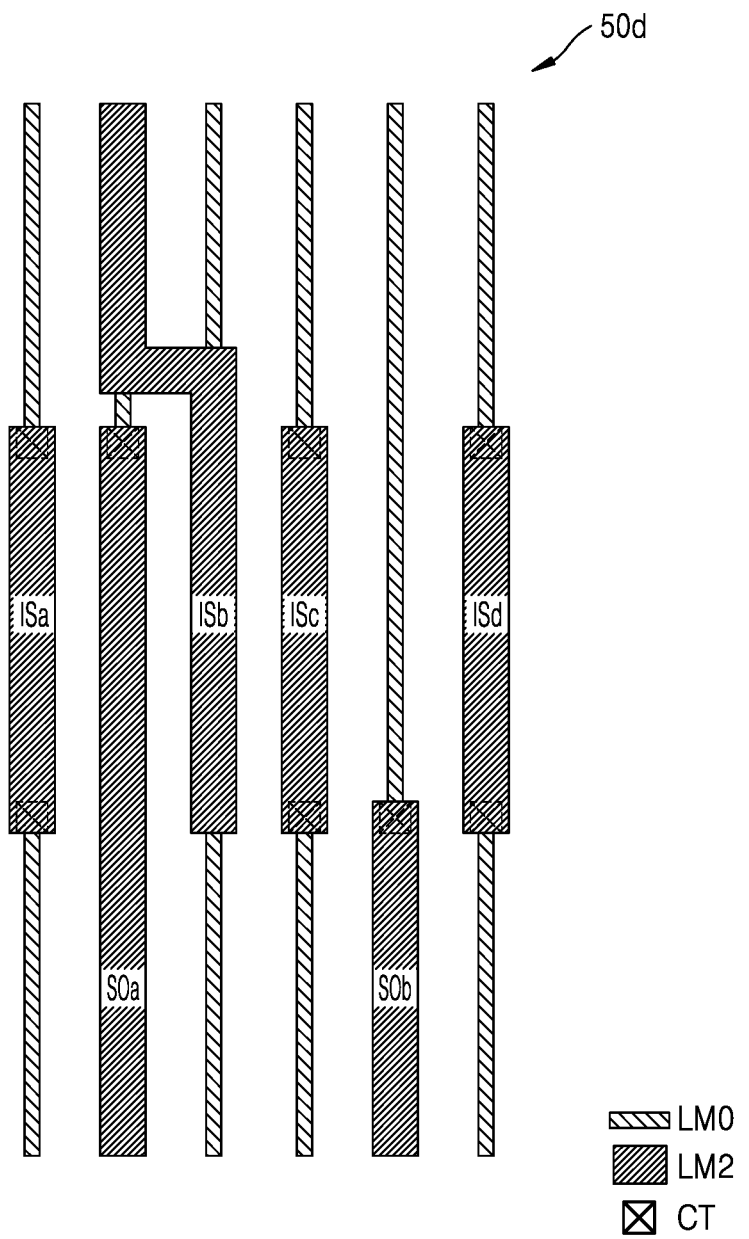

FIG. 22 is a layout 50*d* of the first and third metal layers LM0 and LM2 according to an example embodiment of the inventive concept.

Referring to FIG. 22, the layout 50*d* corresponds to a modified example of the layout 50*a* of FIG. 19, and a duplicated description is omitted. The third metal layer LM2 may include the first and second sensing node patterns SOa and SOb and the first to fourth internal signal patterns ISa to ISd. The first and second sensing node patterns SOa and SOb and the first to fourth internal signal patterns ISa to ISd may be alternately provided. Hereinafter, patterns on the plurality of tracks of the third metal layer LM2 will be described. For example, the first internal signal pattern ISa may be provided on the first track, the first sensing node pattern SOa may be provided on the second track, the second internal signal pattern ISb may be provided on the second and third tracks, the third internal signal pattern ISc may be provided on the fourth track, the second sensing node patterns SOb may be provided on the fifth track, and the fourth internal signal pattern ISd may be provided on the sixth track.

Figure 23:
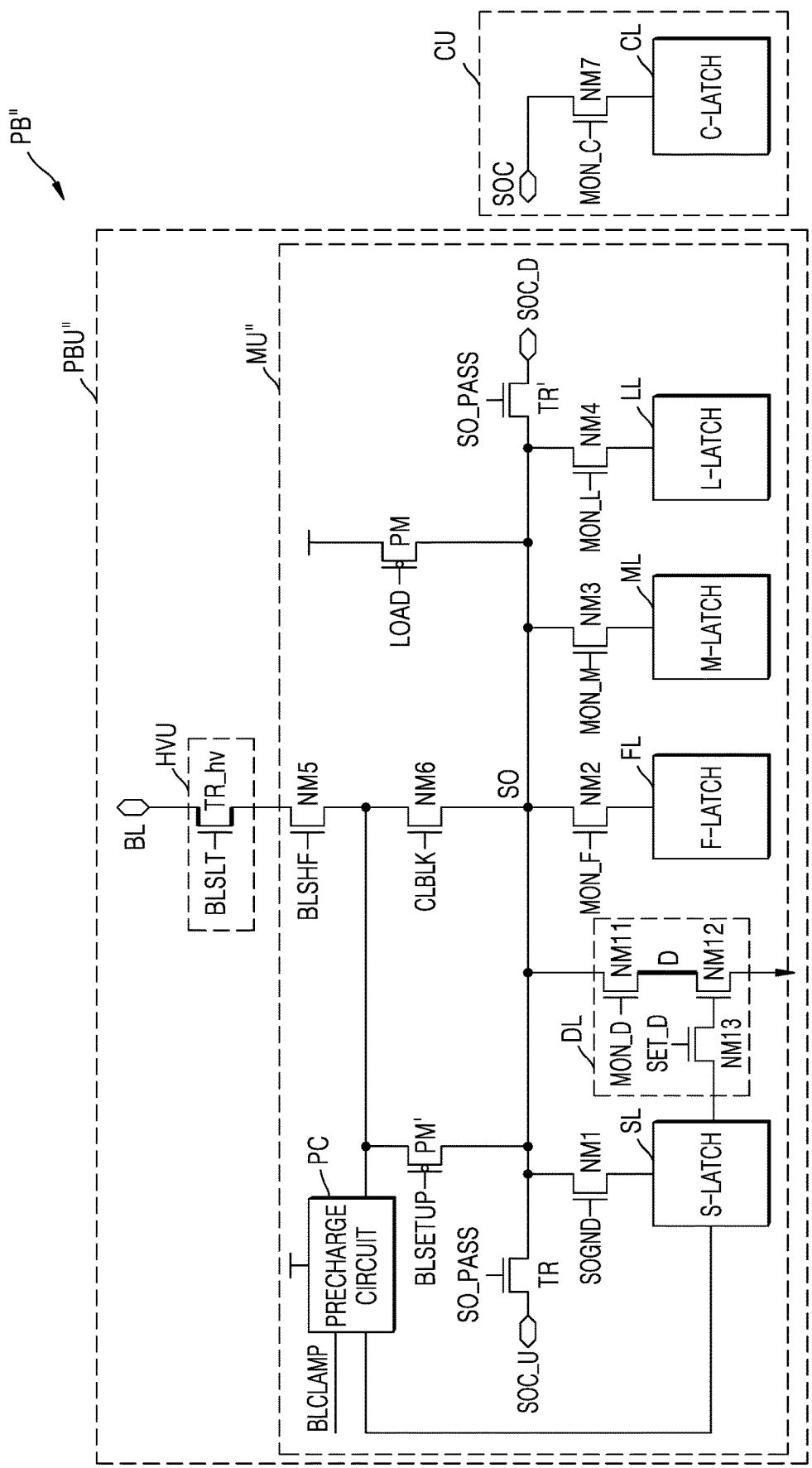
FIGS. 23 and 24 are circuit diagrams of page buffers according to some example embodiments of the inventive concept.

FIG. 23 is a circuit diagram of a page buffer PB" according to an example embodiment of the inventive concept.

Referring to FIG. 23, the page buffer PB" corresponds to a modified example of the page buffer PB shown in FIG. 5, and the description made above with respect to the page buffer PB may also be applied to the example embodiment. The page buffer PB" may further include a dynamic latch DL when compared to the page buffer PB. In addition, in some embodiments, the page buffer PB" may include one pass transistor TR" instead of the first and second pass transistors TR and TR', as shown in FIG. 8.

The dynamic latch DL may include transistors NM11, NM12, and NM13. The transistor NM11 may be provided between the sensing node SO and a dynamic node D, the transistor NM12 may be provided between the dynamic node D and a ground terminal, and the transistor NM13 may be provided between the S-LATCH SL and a gate of the transistor NM12. The transistor NM11 may be driven by a monitor signal MON_D, and the transistor NM13 may be driven by a set signal SET_D.

Figure 24:
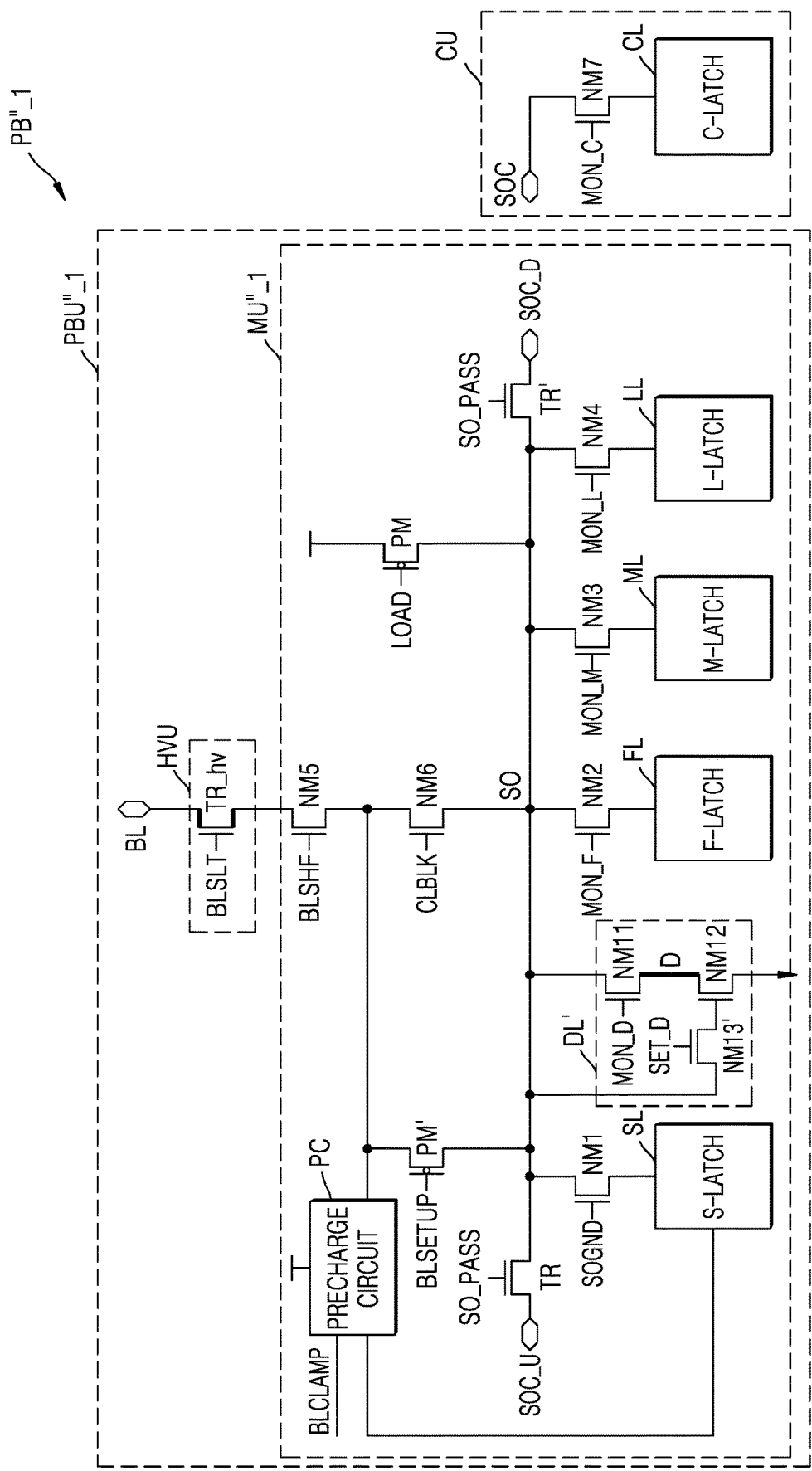

FIG. 24 is a circuit diagram of a page buffer PB"_1 according to an example embodiment of the inventive concept.

Referring to FIG. 24, the page buffer PB"_1 corresponds to a modified example of the page buffer PB" shown in FIG. 23, and the description made above with respect to the page buffer PB" may also be applied to the example embodiment. The page buffer PB"_1 may include a dynamic latch DL', and the dynamic latch DL' may include transistors NM11, NM12, and NM13'. In this case, the transistor NM13' may be provided between the sensing node SO and the gate of the transistor NM12.

Figure 25:
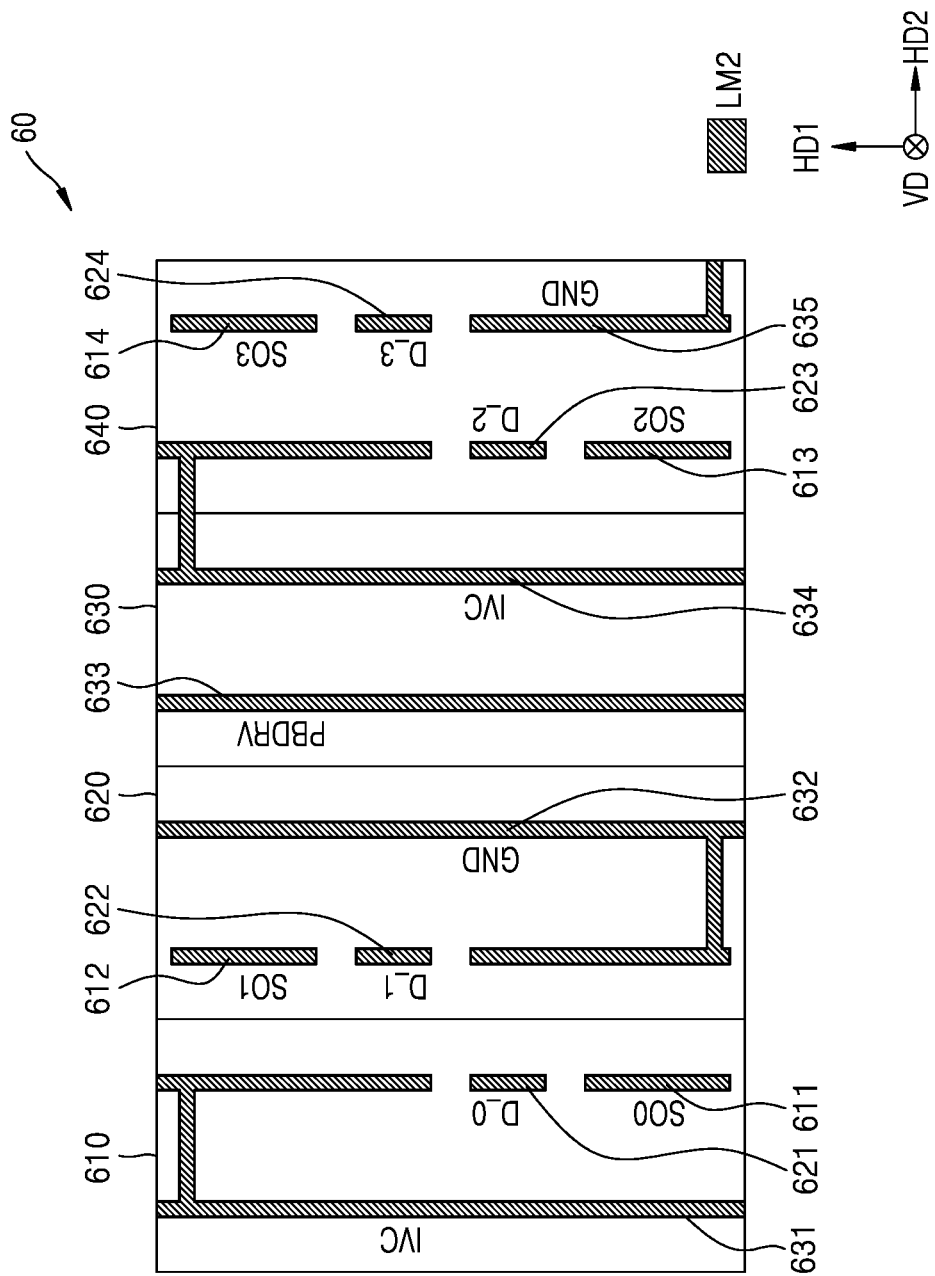
FIGS. 25 to 28 are layouts of the third metal layer according to some example embodiments of the inventive concept.

FIG. 25 is a layout 60 of the third metal layer LM2 according to an example embodiment of the inventive concept.

Referring to FIG. 25, first to fourth page buffer units 610 to 640 may be provided in the second horizontal direction HD2, and for example, each of the first to fourth page buffer units 610 to 640 may correspond to a page buffer unit PBU" of FIG. 23 or a page buffer unit PBU"_1 of FIG. 24. The third metal layer LM2 may include metal patterns 611, 612, 613, 614, 621, 622, 623, 624, 631, 632, 633, 634 and 635, and may be provided above the first to fourth page buffer units 610 to 640 in the vertical direction VD.

The metal patterns 611 to 614 may correspond to the first to fourth sensing nodes SO0 to SO3, respectively, and the metal patterns 621 to 624 may correspond to first to fourth dynamic nodes D_0 to D_3, respectively. In this case, the first sensing node SO0 and the first dynamic node D_0 may be connected to transistors included in the first page buffer unit 610, for example, connected to the transistor NM11 of FIG. 23 or 24. Likewise, the second sensing node SO1 and the second dynamic node D_1 may be connected to transistors included in the second page buffer unit 620, the third sensing node SO2 and the third dynamic node D_2 may be connected to transistors included in the third page buffer unit 630, and the fourth sensing node SO3 and the fourth dynamic node D_3 may be connected to transistors included in the fourth page buffer unit 640.

For example, the metal patterns 611 and 621 may be provided in a line in the first horizontal direction HD1, the metal patterns 612 and 622 may be provided in a line in the first horizontal direction HD1, the metal patterns 613 and 623 may be provided in a line in the first horizontal direction HD1, and the metal patterns 614 and 624 may be provided in a line in the first horizontal direction HD1. The internal power supply voltage IVC may be applied to the metal patterns 631 and 634, and the ground voltage GND may be applied to the metal patterns 632 and 635. The first page buffer driver signal PBDRV may be applied to the metal pattern 633, and the metal pattern 633 may be connected to, for example, a column driver.

Figure 26:
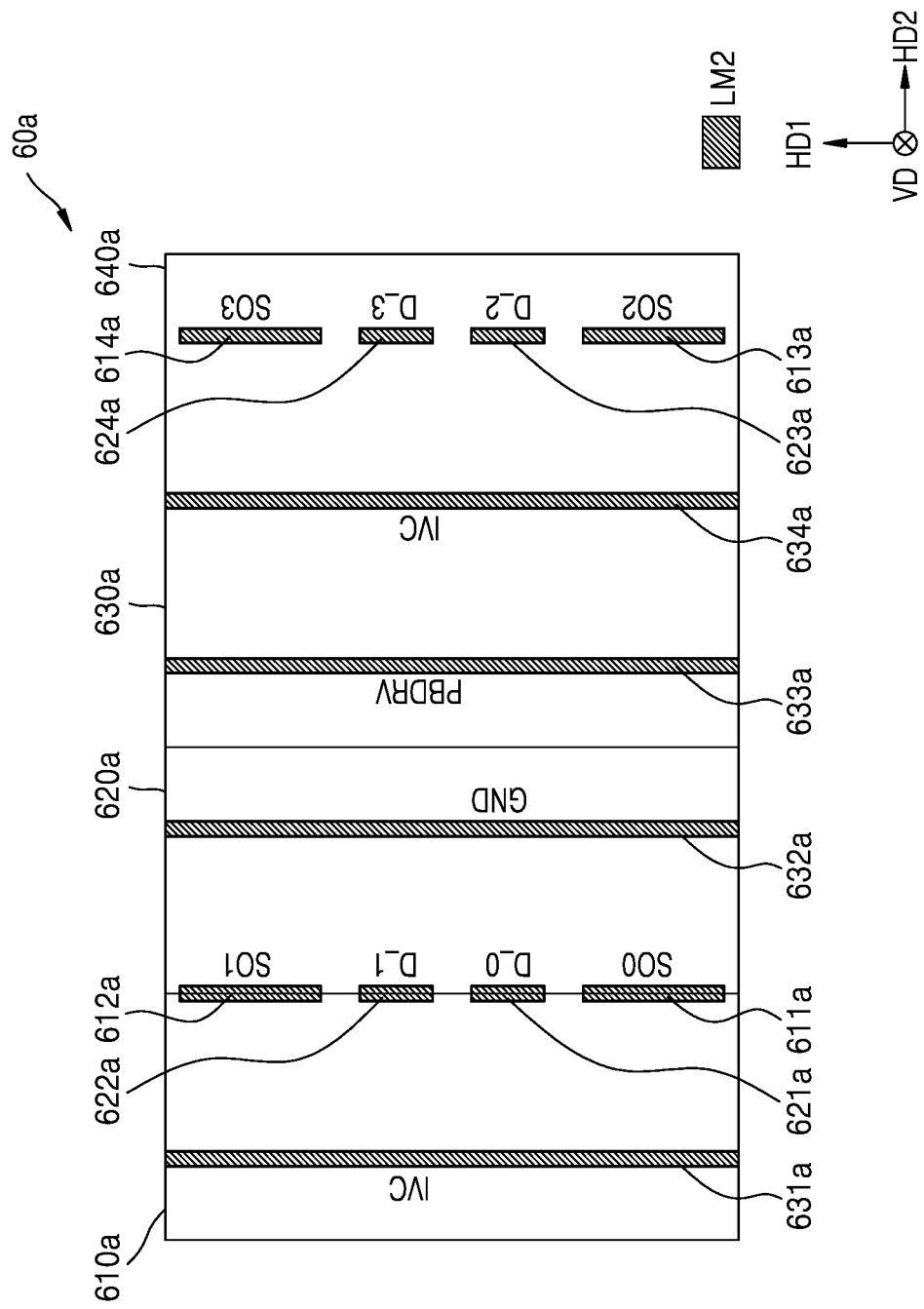

FIG. 26 is a layout 60a of the third metal layer LM2 according to an example embodiment of the inventive concept.

Referring to FIG. 26, first to fourth page buffer units 610a to 640a may be provided in the second horizontal direction HD2, and for example, each of the first to fourth page buffer units 610a to 640a may correspond to the page buffer unit PBU" of FIG. 23 or the page buffer unit PBU"_1 of FIG. 24. The third metal layer LM2 may include metal patterns 611a, 612a, 613a, 614a, 621a, 622a, 623a, 624a, 631a, 632a, 633a and 634a, and may be provided above the first to fourth page buffer units 610a to 640a in the vertical direction VD.

The metal patterns 611a to 614a may correspond to the first to fourth sensing nodes SO0 to SO3, respectively, and the metal patterns 621a to 624a may correspond to the first to fourth dynamic nodes D_0 to D_3, respectively. For example, the metal patterns 611a, 612a, 621a, and 622a may be provided in a line in the first horizontal direction HD1, and the metal patterns 613a, 614a, 623a, and 624a may be provided in a line in the first horizontal direction HD1. The internal power supply voltage IVC may be applied to the metal patterns 631a and 634a, and the ground voltage GND may be applied to the metal pattern 632a. The first page buffer driver signal PBDRV may be applied to the metal pattern 633a, and the metal pattern 633a may be connected to, for example, a column driver.

Figure 27:
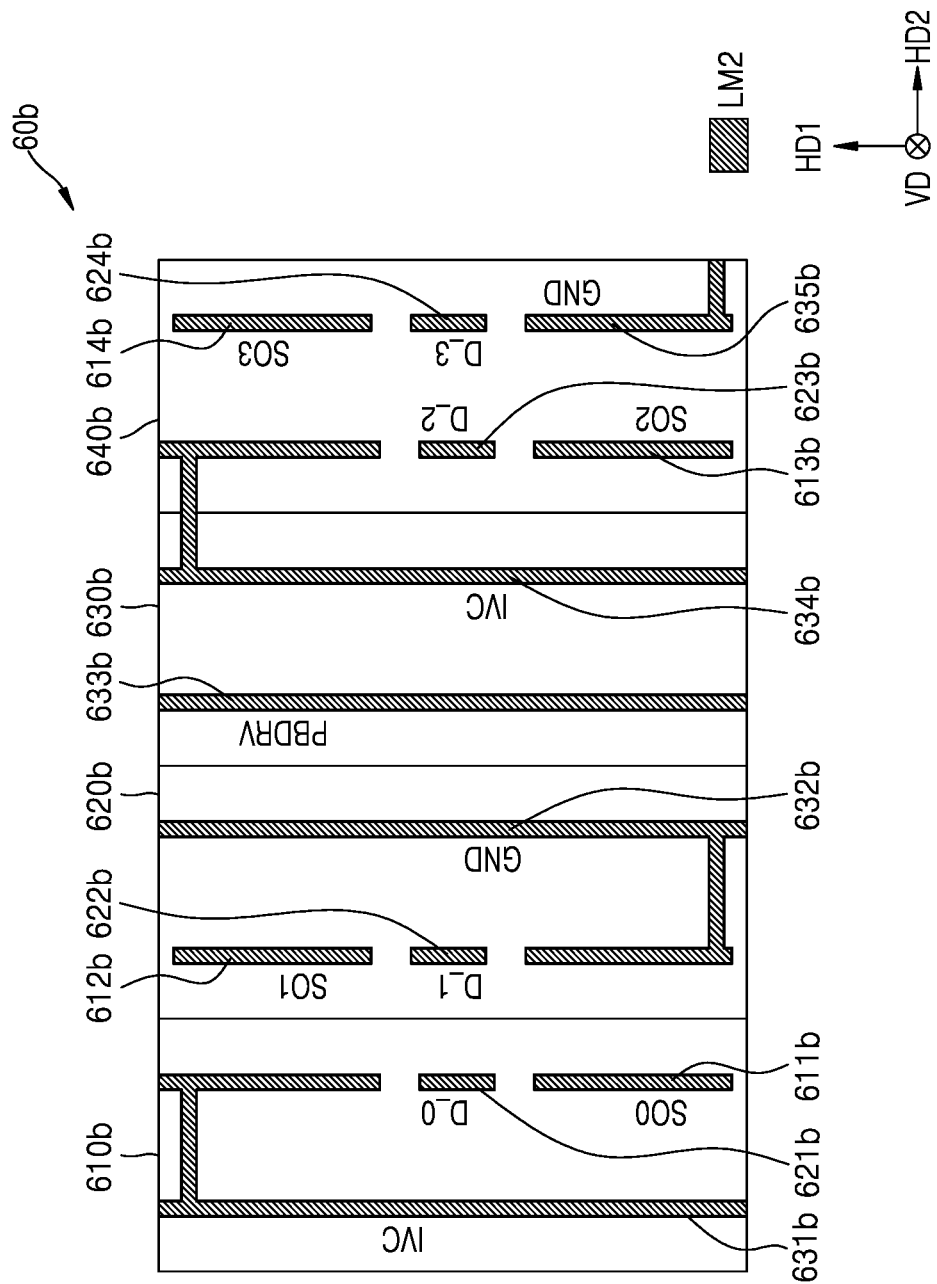

FIG. 27 is a layout 60b of the third metal layer LM2 according to an example embodiment of the inventive concept.

Referring to FIG. 27, first to fourth page buffer units 610b to 640b may be provided in the second horizontal direction HD2, and for example, each of the first to fourth page buffer units 610b to 640b may correspond to the page buffer unit PBU" of FIG. 23 or the page buffer unit PBU"_1 of FIG. 24. The third metal layer LM2 may include metal patterns 611b, 612b, 613b, 614b, 621b, 622b, 623b, 624b, 631b, 632b, 633b, 634b and 635b and may be provided above the first to fourth page buffer units 610b to 640b in the vertical direction VD.

The metal patterns 611b to 614b may correspond to the first to fourth sensing nodes SO0 to SO3, respectively, and the metal patterns 621b to 624b may correspond to the first to fourth dynamic nodes D_0 to D_3, respectively. For example, the metal patterns 611b and 621b may be provided in a line in the first horizontal direction HD1, the metal patterns 612b and 622b may be provided in a line in the first horizontal direction HD1, the metal patterns 613b and 623b may be provided in a line in the first horizontal direction HD1, and the metal patterns 614b and 624b may be provided in a line in the first horizontal direction HD1. The internal power supply voltage IVC may be applied to the metal patterns 631b and 634b, and the ground voltage GND may be applied to the metal patterns 632b and 635b. The first page buffer driver signal PBDRV may be applied to the metal pattern 633b, and the metal pattern 633b may be connected to, for example, a column driver.

Figure 28:
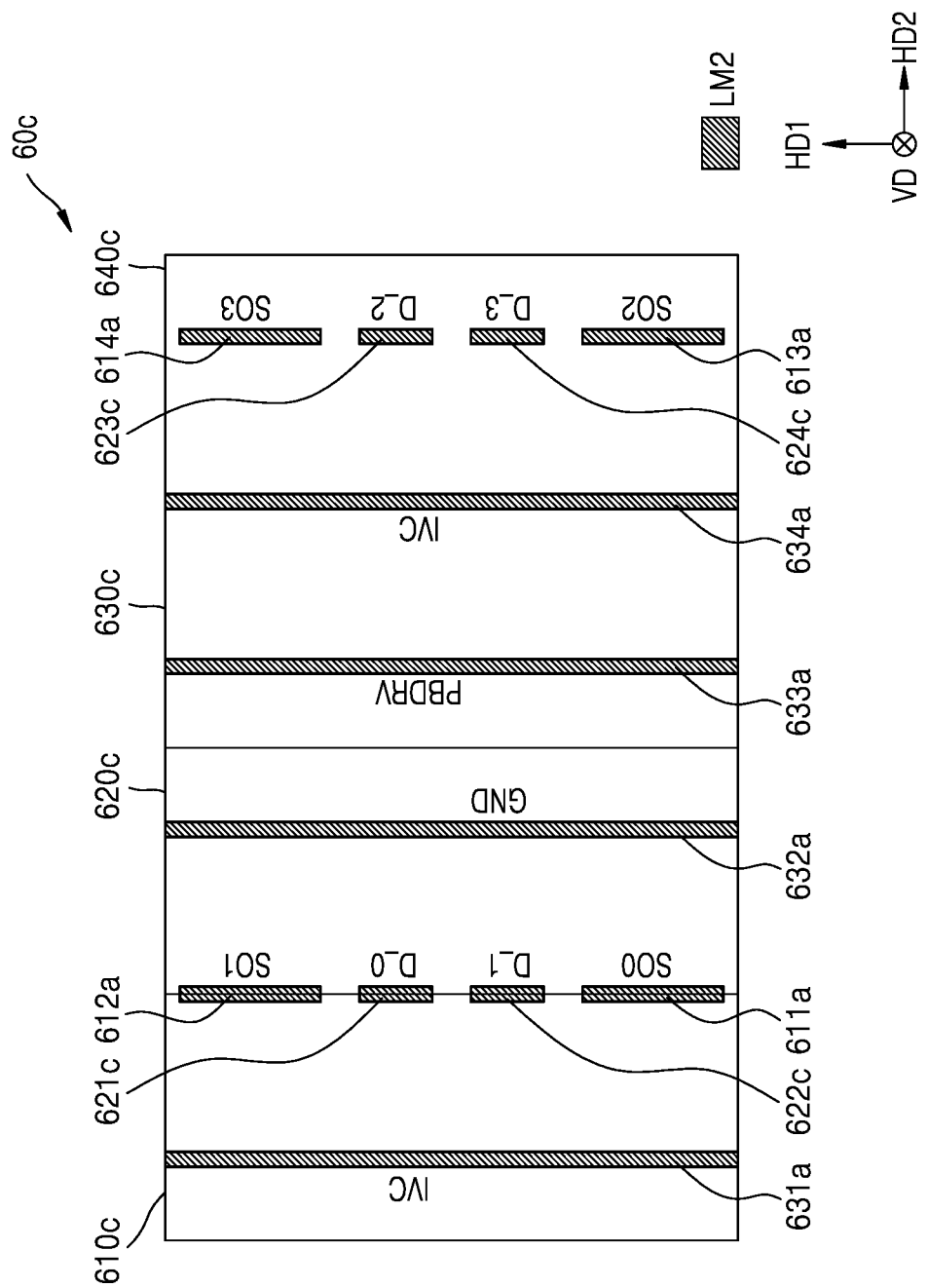

FIG. 28 is a layout 60c of the third metal layer LM2 according to an example embodiment of the inventive concept.

Referring to FIG. 28, first to fourth page buffer units 610c to 640c may be provided in the second horizontal direction HD2, and for example, each of the first to fourth page buffer units 610c to 640c may correspond to the page buffer unit PBU" of FIG. 23 or the page buffer unit PBU"_1 of FIG. 24. The third metal layer LM2 may include metal patterns 611a to 614a, 621c to 624c, and 631a to 634a and may be provided above the first to fourth page buffer units 610c to 640c in the vertical direction VD.

The metal patterns 611a to 614a may correspond to the first to fourth sensing nodes SO0 to SO3, respectively, and the metal patterns 621c to 624c may correspond to the first to fourth dynamic nodes D_0 to D_3, respectively. For example, the metal patterns 611a, 612a, 621c, and 622c may be provided in a line in the first horizontal direction HD1, and the metal patterns 613a, 614a, 623c, and 624c may be provided in a line in the first horizontal direction HD1. The internal power supply voltage IVC may be applied to the metal patterns 631a and 634a, and the ground voltage GND may be applied to the metal pattern 632a. The first page buffer driver signal PBDRV may be applied to the metal pattern 633a, and the metal pattern 633a may be connected to, for example, a column driver.

Figure 29:
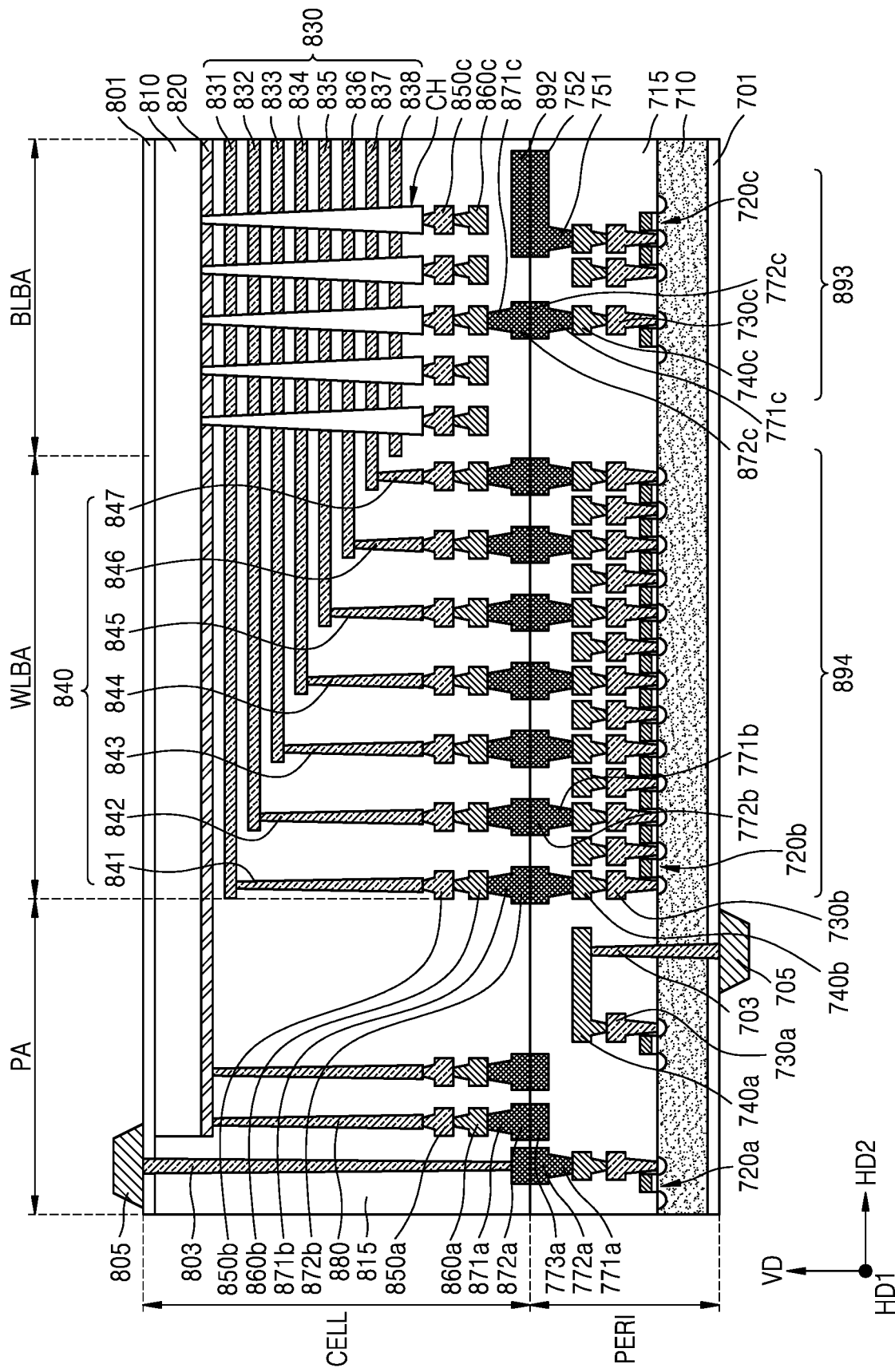
FIG. 29 is a cross-sectional view of a memory device according to an example embodiment of the inventive concept.

FIG. 29 is a cross-sectional view of a memory device 900 according to an example embodiment of the inventive concept.

Referring to FIG. 29, the memory device 900 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals are formed of copper (Cu), the bonding manner may be a Cu—Cu bonding manner, and the bonding metals may also be formed of aluminum or tungsten. The embodiments illustrated with reference to FIGS. 1 to 27 may be implemented in the memory device 900, and for example, a page buffer circuit described above with reference to FIGS. 1 to 27 may be provided in the peripheral circuit region PERI.

Each of the peripheral circuit region PERI and the cell region CELL of the memory device 900 may include an external pad bonding area PA, a word line bonding area WLBA, and a bit line bonding area BLBA. The peripheral circuit region PERI may include a first substrate 710, an interlayer insulating layer 715, a plurality of circuit elements 720a, 720b, and 720c formed on the first substrate 710, first metal layers 730a, 730b, and 730c respectively connected to the plurality of circuit elements 720a, 720b, and 720c, and second metal layers 740a, 740b, and 740c respectively formed on the first metal layers 730a, 730b, and 730c. In an example embodiment, the first metal layers 730a, 730b, and 730c may be formed of tungsten having a relatively high resistance, and the second metal layers 740a, 740b, and 740c may be formed of copper having a relatively low resistance.

According to an example embodiment, although only the first metal layers 730a, 730b, and 730c and the second metal layers 740a, 740b, and 740c are shown and described, the example embodiment is not limited thereto, and one or more metal layers may be further formed on the second metal layers 740a, 740b, and 740c. At least a portion of the one or more metal layers formed on the second metal layers 740a, 740b, and 740c may be formed of aluminum or the like having a lower resistance than that of Cu forming the second metal layers 740a, 740b, and 740c.

The interlayer insulating layer 715 may be provided on the first substrate 710 and cover the plurality of circuit elements 720a, 720b, and 720c, the first metal layers 730a, 730b, and 730c, and the second metal layers 740a, 740b, and 740c and may include an insulating material such as silicon oxide or silicon nitride.

Lower bonding metals 771b and 772b may be formed on the second metal layer 740b in the word line bonding area WLBA. In the word line bonding area WLBA, the lower bonding metals 771b and 772b in the peripheral circuit region PERI may be electrically connected to upper bonding metals 871b and 872b in a bonding manner, and the lower bonding metals 771b and 772b and the upper bonding metals 871b and 872b may be formed of aluminum, copper, tungsten, or the like. The upper bonding metals 871b and 872b in the cell region CELL may be referred as first metal pads, and the lower bonding metals 771b and 772b in the peripheral circuit region PERI may be referred as second metal pads.

The cell region CELL may include at least one memory block. The cell region CELL may include a second substrate 810 and a common source line 820. On the second substrate 810, a plurality of word lines 831 to 838 (i.e., 830) may be stacked in a direction (the vertical direction VD), perpendicular to an upper surface of the second substrate 810. At least one string select line and at least one ground select line may be arranged on and below the plurality of word lines 830, respectively, and the plurality of word lines 830 may be provided between the at least one string select line and the at least one ground select line.

In the bit line bonding area BLBA, a channel structure CH may extend in a direction, perpendicular to the upper surface of the second substrate 810, and pass through the plurality of word lines 830, the at least one string select line, and the at least one ground select line. The channel structure CH may include a data storage layer, a channel layer, a buried insulating layer, and the like, and the channel layer may be electrically connected to a first metal layer 850c and a second metal layer 860c. For example, the first metal layer 850c may be a bit line contact, and the second metal layer 860c may be a bit line. In an example embodiment, the bit line 860c may extend in a first direction (a Y-axis direction), parallel to the upper surface of the second substrate 810.

In an example embodiment illustrated in FIG. 29, an area in which the channel structure CH, the bit line 860c, and the like are provided may be defined as the bit line bonding area BLBA. In the bit line bonding area BLBA, the bit line 860c may be electrically connected to the circuit elements 720c providing a page buffer 893 in the peripheral circuit region PERI. For example, the bit line 860c may be connected to upper bonding metals 871c and 872c in the cell region CELL, and the upper bonding metals 871c and 872c may be connected to lower bonding metals 771c and 772c connected to the circuit elements 720c of the page buffer 893.

In the word line bonding area WLBA, the plurality of word lines 830 may extend in the second horizontal direction HD2, parallel to the upper surface of the second substrate 810, and may be connected to a plurality of cell contact plugs 841 to 847 (i.e., 840). The plurality of word lines 830 and the plurality of cell contact plugs 840 may be connected to each other in pads provided by at least a portion of the plurality of word lines 830 extending in different lengths in the second horizontal direction HD2. A first metal layer 850b and a second metal layer 860b may be connected to an upper portion of the plurality of cell contact plugs 840 connected to the plurality of word lines 830, sequentially. The plurality of cell contact plugs 840 may be connected to the peripheral circuit region PERI through the upper bonding metals 871b and 872b of the cell region CELL and the lower bonding metals 771b and 772b of the peripheral circuit region PERI in the word line bonding area WLBA.

The plurality of cell contact plugs 840 may be electrically connected to the circuit elements 720b providing a row decoder 894 in the peripheral circuit region PERI. In an example embodiment, operating voltages of the circuit elements 720b providing the row decoder 894 may be different from operating voltages of the circuit elements 720c providing the page buffer 893. For example, the operating voltages of the circuit elements 720c providing the page buffer 893 may be greater than the operating voltages of the circuit elements 720b providing the row decoder 894.

A common source line contact plug 880 may be provided in the external pad bonding area PA. The common source line contact plug 880 may be formed of a conductive material such as a metal, a metal compound, or polysilicon, and may be electrically connected to the common source line 820. A first metal layer 850a and a second metal layer 860a may be stacked on an upper portion of the common source line contact plug 880, sequentially. For example, an area in which the common source line contact plug 880, the first metal layer 850a, and the second metal layer 860a are provided may be defined as the external pad bonding area PA.

Input-output pads 705 and 805 may be provided in the external pad bonding area PA. Referring to FIG. 29, a lower insulating film 701 covering a lower surface of the first substrate 710 may be formed below the first substrate 710, and a first input-output pad 705 may be formed on the lower insulating film 701. The first input-output pad 705 may be connected to at least one of the plurality of circuit elements 720a, 720b, and 720c provided in the peripheral circuit region PERI through a first input-output contact plug 703, and may be separated from the first substrate 710 by the lower insulating film 701. In addition, a side insulating film may be provided between the first input-output contact plug 703 and the first substrate 710 to electrically separate the first input-output contact plug 703 and the first substrate 710.

Referring to FIG. 29, an upper insulating film 801 covering the upper surface of the second substrate 810 may be formed on the second substrate 810, and a second input-output pad 805 may be provided on the upper insulating film 801. The second input-output pad 805 may be connected to at least one of the plurality of circuit elements 720a, 720b, and 720c provided in the peripheral circuit region PERI through a second input-output contact plug 803.

According to embodiments, the second substrate 810 and the common source line 820 may not be provided in an area in which the second input-output contact plug 803 is provided. Also, the second input-output pad 805 may not overlap the word lines 830 in the vertical direction VD. Referring to FIG. 29, the second input-output contact plug 803 may be separated from the second substrate 810 in a direction, parallel to the upper surface of the second substrate 810, and may pass through the interlayer insulating layer 815 of the cell region CELL to be connected to the second input-output pad 805.

According to embodiments, the first input-output pad 705 and the second input-output pad 805 may be selectively formed. For example, the memory device 900 may include only the first input-output pad 705 provided on the first substrate 710 or the second input-output pad 805 provided on the second substrate 810. Alternatively, the memory device 900 may include both the first input-output pad 705 and the second input-output pad 805.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 900 may include a lower metal pattern 773a, corresponding to an upper metal pattern 872a formed in an uppermost metal layer of the cell region CELL, and having the same shape as the upper metal pattern 872a of the cell region CELL, in an uppermost metal layer of the peripheral circuit region PERI. In the peripheral circuit region PERI, the lower metal pattern 773a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 771b and 772b may be formed on the second metal layer 740b in the word line bonding area WLBA. In the word line bonding area WLBA, the lower bonding metals 771b and 772b of the peripheral circuit region PERI may be electrically connected to the upper bonding metals 871b and 872b of the cell region CELL by a Cu—Cu bonding manner.

Further, in the bit line bonding area BLBA, an upper metal pattern 892, corresponding to a lower metal pattern 752 formed in the uppermost metal layer of the peripheral circuit region PERI, and having the same shape as the lower metal pattern 752 of the peripheral circuit region PERI, may be formed in an uppermost metal layer of the cell region CELL. A contact may not be formed on the upper metal pattern 892 formed in the uppermost metal layer of the cell region CELL.

Figure 30:
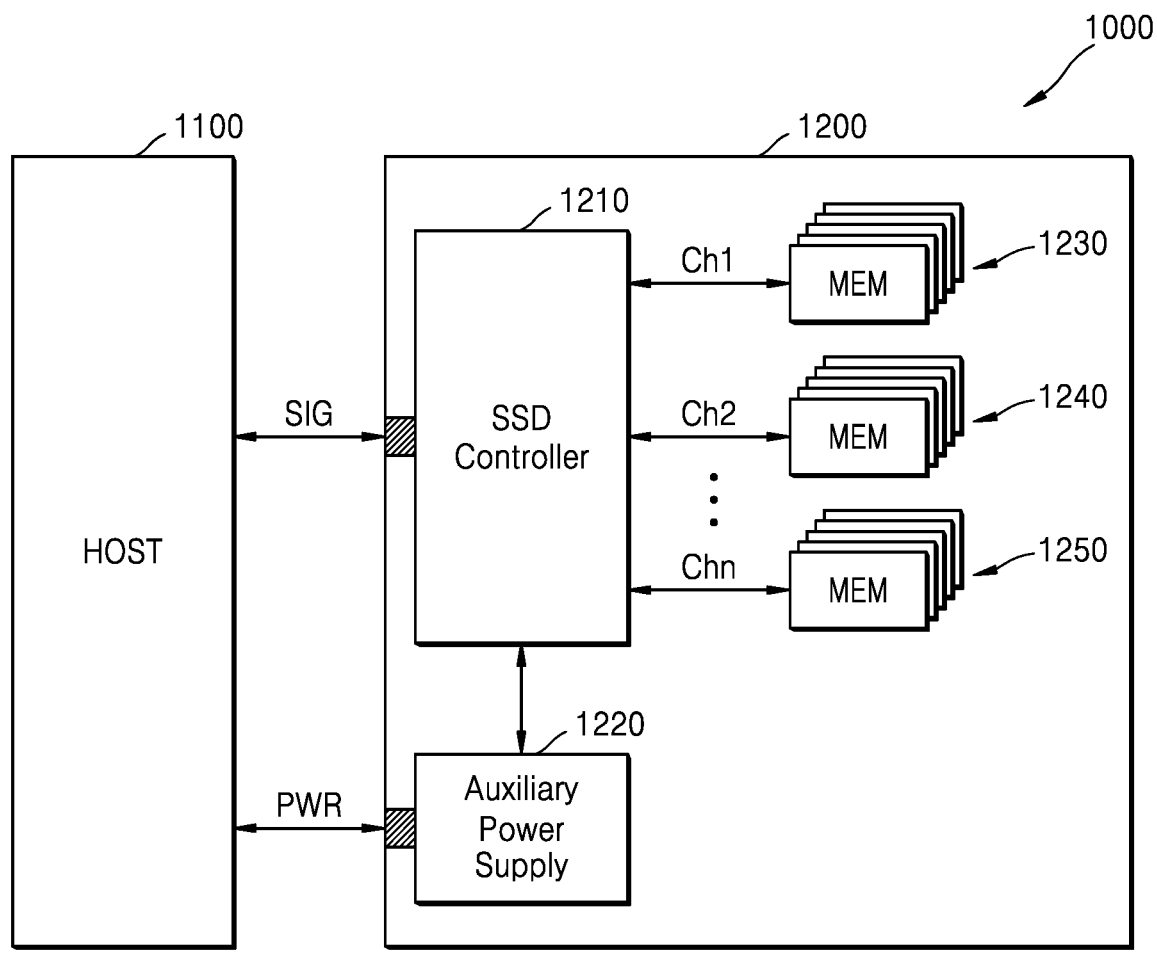
FIG. 30 is a block diagram of an example of a solid state drive (SSD) system to which a memory device according to an example embodiment of the inventive concept is applied.

FIG. 30 is a block diagram of an example of a solid state drive (SSD) system 1000 to which a memory device according to some example embodiments of the inventive concept is applied.

Referring to FIG. 30, the SSD system 1000 may include a host 1100 and an SSD 1200. The SSD 1200 transmits and receives signals to and from the host 1100 through a signal connector and receives power through a power connector. The SSD 1200 may include an SSD controller 1210, an auxiliary power supply 1220, and memory devices 1230, 1240, and 1250. The memory devices 1230, 1240, and 1250 may be vertically stacked NAND flash memory devices and communicate with the SSD controller through channels Ch1, Ch2 ... Chn. Herein, the SSD 1200 may be implemented using the example embodiments described above with reference to FIGS. 1 to 29.

While the inventive concept has been particularly shown and described with reference to embodiments thereof, it will be understood that various changes in form and details may be made therein without departing from the spirit and scope of the following claims.

What is claimed is:
1. A memory device comprising:
a memory cell array including a plurality of memory cells; and
a page buffer circuit connected to the memory cell array, the page buffer circuit being provided in a page buffer region, the page buffer region including a main region and a cache region arranged in a first horizontal direction, and the page buffer circuit comprising a first page buffer unit and a second page buffer unit arranged in the main region in a second horizontal direction,
wherein the first page buffer unit comprises a first sensing node, and the second page buffer unit comprises a second sensing node,
wherein the first sensing node comprises:
a first lower metal pattern provided in a lower metal layer; and
a first upper metal pattern provided in an upper metal layer provided above the lower metal layer in a vertical direction, and the first upper metal pattern electrically connected to the first lower metal pattern, and wherein the second sensing node comprises:
- a second lower metal pattern provided in the lower metal layer; and
- a second upper metal pattern provided in the upper metal layer, the second upper metal pattern electrically connected to the second lower metal pattern, and the second upper metal pattern not adjacent to the first upper metal pattern in the second horizontal direction.

2. The memory device of claim 1, wherein the page buffer circuit further comprises a first cache latch and a second cache latch provided in the cache region, and
wherein the first cache latch and the second cache latch are adjacent to each other in the second horizontal direction and are respectively connected to the first page buffer unit and the second page buffer unit, and adjacent to each other in the second horizontal direction.

3. The memory device of claim 1, wherein the first and second lower metal patterns extend in a same direction as the first and second upper metal patterns.

4. The memory device of claim 3, wherein the first and second page buffer units are connected to the plurality of memory cells through first and second bit lines, respectively, and
the first and second bit lines extend in a same direction as the first and second lower metal patterns and the first and second upper metal patterns.

5. The memory device of claim 1, wherein the upper metal layer comprises:
- a first power supply pattern provided above the first page buffer unit;
- the first upper metal pattern provided above the first page buffer unit, and adjacent to the first power supply pattern in the second horizontal direction;
- the second upper metal pattern provided above the second page buffer unit; and
- a second power supply pattern provided above the second page buffer unit, and adjacent to the second upper metal pattern in the second horizontal direction.

6. The memory device of claim 1, wherein the upper metal layer comprises:
- an internal signal pattern provided above the first page buffer unit;
- a first power supply pattern provided above the first page buffer unit, and adjacent to the internal signal pattern in the second horizontal direction; and
- the first and second upper metal patterns provided above the second page buffer unit.

7. The memory device of claim 1, wherein the upper metal layer comprises:
- a first power supply pattern provided above the first page buffer unit;
- a second power supply pattern provided above the second page buffer unit; and
- the first and second upper metal patterns arranged in the first horizontal direction between the first and second power supply patterns.

8. The memory device of claim 1, wherein the upper metal layer comprises:
- an internal signal pattern provided above the first page buffer unit;
- the first and second upper metal patterns provided above the second page buffer unit, and arranged in the first horizontal direction; and
- a power supply pattern provided between the internal signal pattern and the first and second upper metal patterns.

9. The memory device of claim 1,
wherein the upper metal layer comprises:
- a first internal signal pattern on a first track;
- the first upper metal pattern on a second track;
- a second internal signal pattern on a third track;
- a third internal signal pattern on a fourth track; and
- the second upper metal pattern on a fifth track, and
wherein the first, second and third internal signal patterns and the first and second upper metal patterns extend in the first horizontal direction.

10. The memory device of claim 9,
wherein the upper metal layer further comprises:
- a first power supply pattern on the first track; and
- a second power supply pattern on the third track, and
wherein the first power supply pattern, the first upper metal pattern, and the second power supply pattern are adjacent to each other in the second horizontal direction.

11. The memory device of claim 1,
wherein the lower metal layer comprises:
- a first power supply pattern;
- the first lower metal pattern provided adjacent to the first power supply pattern in the second horizontal direction;
- a second power supply pattern provided adjacent to the first lower metal pattern in the second horizontal direction; and
- the second lower metal pattern provided adjacent to the second power supply pattern in the second horizontal direction, and
wherein the first and second power supply patterns and the first and second lower metal patterns extend in the first horizontal direction.

12. The memory device of claim 1, wherein the first page buffer unit comprises a first dynamic latch connected to the first sensing node, the first dynamic latch including a first dynamic node,
wherein the second page buffer unit comprises a second dynamic latch connected to the second sensing node, the second dynamic latch including a second dynamic node, wherein the first dynamic node of the comprises:
- a third lower metal pattern provided in the lower metal layer; and
- a third upper metal pattern provided in the upper metal layer and electrically connected to the third lower metal pattern, and
wherein the second dynamic node comprises:
- a fourth lower metal pattern provided in the lower metal layer; and
- a fourth upper metal pattern provided in the upper metal layer and electrically connected to the fourth lower metal pattern.

13. The memory device of claim 12, wherein the first upper metal pattern and the third upper metal pattern are arranged in the first horizontal direction,
the second upper metal pattern and the fourth upper metal pattern are arranged in the first horizontal direction, and
the third upper metal pattern and the fourth upper metal pattern are not adjacent to each other in the second horizontal direction.

14. The memory device of claim 12, wherein the first to fourth upper metal patterns are arranged in the first horizontal direction.

15. The memory device of claim 12, wherein the first upper metal pattern and the third upper metal pattern are arranged in the first horizontal direction,
the second upper metal pattern and the fourth upper metal pattern are arranged in the first horizontal direction, and
the third upper metal pattern and the fourth upper metal pattern are adjacent to each other in the second horizontal direction.

16. A memory device comprising:
a first semiconductor layer including a plurality of memory cells respectively connected to a plurality of bit lines extending in a first horizontal direction; and
a second semiconductor layer provided in a vertical direction that is perpendicular to the first semiconductor layer, the second semiconductor layer including a plurality of page buffers,
wherein the plurality of page buffers comprises a first page buffer unit including a first sensing node and a second page buffer unit including a second sensing node,
wherein the first sensing node comprises:
    a first lower metal pattern provided in a lower metal layer; and
a first upper metal pattern provided in an upper metal layer provided above the lower metal layer in the vertical direction, and electrically connected to the lower metal pattern,
wherein the second sensing node comprises:
    a second lower metal pattern provided in the lower metal layer; and
    a second upper metal pattern provided in the upper metal layer,
        wherein the second page buffer unit is provided adjacent to the first page buffer unit in a second horizontal direction, and
        wherein the first upper metal pattern is not adjacent to the second upper metal pattern in the second horizontal direction.

17. The memory device of claim 16, wherein the plurality of page buffers comprise:
a plurality of first page buffer units provided, in the first horizontal direction, in a main region of the second semiconductor layer;
a plurality of second page buffer units provided, in the first horizontal direction, in the main region of the second semiconductor layer, and adjacent to the first page buffer units in the second horizontal direction;
a plurality of first cache latches provided, in the first horizontal direction, in a cache region of the second semiconductor layer, and respectively corresponding to the first page buffer units; and
a plurality of second cache latches provided, in the first horizontal direction, in the cache region of the second semiconductor layer, adjacent to the first cache latches in the second horizontal direction, and respectively corresponding to the second page buffer units,
wherein the main region and the cache region are adjacent to each other in the first horizontal direction.

18. A memory device comprising:
a memory cell region including a plurality of memory cells and a first metal pad; and
a peripheral circuit region including a second metal pad and connected to the memory cell region in a vertical direction through the first metal pad and the second metal pad,
wherein the peripheral circuit region further includes a plurality of page buffers,
wherein the plurality of page buffers comprises a first page buffer unit including a first sensing node and a second page buffer unit including a second sensing node,
wherein the first sensing node comprises:
    a first lower metal pattern provided in a lower metal layer; and
    a first upper metal pattern provided in an upper metal layer provided above the lower metal layer in the vertical direction, and electrically connected to the lower metal pattern,
wherein the second sensing node comprises:
    a second lower metal pattern provided in the lower metal layer; and
    a second upper metal pattern provided in the upper metal layer,
wherein the second page buffer unit is provided adjacent to the first page buffer unit in a second horizontal direction, and
wherein the first upper metal pattern is not adjacent to the second upper metal pattern in the second horizontal direction.

* * * * *